(12) United States Patent
Marya et al.

(10) Patent No.: US 12,467,814 B2
(45) Date of Patent: Nov. 11, 2025

(54) GRAPHENE-BASED ELECTRICAL CIRCUIT FLUID SYSTEM COMPONENT

(71) Applicant: Schlumberger Technology Corporation, Sugar Land, TX (US)

(72) Inventors: Manuel Paul Marya, Sugar Land, TX (US); Alireza Zolfaghari, Rosharon, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 353 days.

(21) Appl. No.: 18/249,062

(22) PCT Filed: Oct. 15, 2020

(86) PCT No.: PCT/US2020/055713
§ 371 (c)(1),
(2) Date: Apr. 14, 2023

(87) PCT Pub. No.: WO2022/081156
PCT Pub. Date: Apr. 21, 2022

(65) Prior Publication Data
US 2023/0393008 A1 Dec. 7, 2023

(51) Int. Cl.
*G01L 9/08* (2006.01)
*E21B 47/00* (2012.01)
(Continued)

(52) U.S. Cl.
CPC .............. *G01L 9/08* (2013.01); *E21B 47/006* (2020.05); *E21B 47/06* (2013.01); *E21B 47/14* (2013.01); *G01L 9/12* (2013.01); *H10N 30/302* (2023.02); *H10N 30/852* (2023.02); *H10N 30/878* (2023.02); *E21B 43/122* (2013.01);
(Continued)

(58) Field of Classification Search
CPC . G01L 9/08; G01L 9/12; E21B 47/006; E21B 47/06
See application file for complete search history.

(56) References Cited

U.S. PATENT DOCUMENTS

| 7,325,605 B2 | 2/2008 | Fripp et al. |
| 7,513,147 B2 | 4/2009 | Yogeswaren |

(Continued)

FOREIGN PATENT DOCUMENTS

| KR | 20120111607 A | 10/2012 |
| WO | 2015175060 A2 | 11/2015 |

(Continued)

OTHER PUBLICATIONS

Cesano et al. "Multifunctional Conductive Paths Obtained by Laser Processing of Non-Conductive Carbon Nanotube/Polypropylene Composites," Nanomaterials 2021, 11, 604 (Year: 2021).*

(Continued)

*Primary Examiner* — John Fitzgerald
(74) *Attorney, Agent, or Firm* — Jeffrey D. Frantz

(57) ABSTRACT

A fluid system component can include a support body that includes a surface; and an electrical circuit supported at least in part by the surface, where the electrical circuit includes graphene adjacent to a composite material that includes a polymer convertible to graphene, and where the electrical circuit generates a signal responsive to deformation of at least a portion of the electrical circuit.

20 Claims, 17 Drawing Sheets

(51) Int. Cl.
    *E21B 47/06*         (2012.01)
    *E21B 47/14*         (2006.01)
    *G01L 9/12*          (2006.01)
    *H10N 30/30*         (2023.01)
    *H10N 30/85*         (2023.01)
    *H10N 30/87*         (2023.01)
    *E21B 43/12*         (2006.01)
    *E21B 43/26*         (2006.01)
    *E21B 47/10*         (2012.01)

(52) U.S. Cl.
    CPC ............ *E21B 43/26* (2013.01); *E21B 47/10* (2013.01); *E21B 2200/08* (2020.05)

(56) References Cited

U.S. PATENT DOCUMENTS

| | | | |
|---|---|---|---|
| 7,536,912 | B2 | 5/2009 | Kim |
| 10,156,490 | B2 | 12/2018 | Singh et al. |
| 11,102,891 | B2* | 8/2021 | Chang .................... H05K 3/388 |
| 11,161,744 | B2* | 11/2021 | Tour ...................... H01S 3/0007 |
| 11,437,620 | B2* | 9/2022 | Tour ...................... H01M 4/663 |
| 11,807,533 | B2* | 11/2023 | Tour .................... B01D 71/0212 |
| 11,812,561 | B2* | 11/2023 | Marya .................... B33Y 10/00 |
| 11,820,664 | B2* | 11/2023 | Marya .................... B29C 64/188 |
| 11,926,524 | B1* | 3/2024 | Uz ......................... H05K 1/0284 |
| 11,938,708 | B1* | 3/2024 | Uz ......................... H05K 1/0277 |
| 12,306,132 | B2* | 5/2025 | Claussen ................ B41M 7/009 |
| 2013/0068008 | A1 | 3/2013 | Kahler et al. |
| 2013/0186195 | A1 | 7/2013 | Schlosser |
| 2013/0285970 | A1* | 10/2013 | Ahn ......................... G06F 3/045<br>324/705 |
| 2016/0010410 | A1* | 1/2016 | Fradkin ..................... G01V 1/22<br>166/212 |
| 2016/0247999 | A1* | 8/2016 | Aliane ................. H10N 30/302 |
| 2017/0062821 | A1 | 3/2017 | Tour et al. |
| 2018/0199441 | A1* | 7/2018 | Chang .................... H05K 3/381 |
| 2019/0088420 | A1 | 3/2019 | Tour et al. |
| 2019/0174637 | A1* | 6/2019 | Chang .................... H05K 3/381 |
| 2021/0332489 | A1* | 10/2021 | Claussen ................ C01B 32/205 |
| 2022/0055904 | A1* | 2/2022 | Tour ...................... H01M 4/587 |
| 2022/0196104 | A1 | 6/2022 | Holen et al. |
| 2022/0267153 | A1* | 8/2022 | Tour ...................... H01M 4/583 |
| 2024/0080989 | A1* | 3/2024 | Marya .................... B33Y 80/00 |
| 2024/0092644 | A1* | 3/2024 | Marya .................... C08L 101/12 |
| 2025/0096039 | A1* | 3/2025 | Reber ............... H01L 21/76823 |
| 2025/0145466 | A1* | 5/2025 | Tour ...................... C01B 32/184 |

FOREIGN PATENT DOCUMENTS

| | | |
|---|---|---|
| WO | 2016133571 A3 | 10/2016 |
| WO | 2020197606 A2 | 10/2020 |

OTHER PUBLICATIONS

Anonymous, "Getting the Vibes with Piezoelectric Coatings", downloaded from [https://www.paint.org/coatingstech-magazine/articles/getting-vibes-piezoelectric-coatings/] on May 11, 2023, 3 pages.
Lin, P. et al., "Laser-induced porous graphene films from commercial polymers," Nature Communications, 2014, pp. 1-8.
Anonymous, "Corrosion Inhibitors for Coatings: Main Types & Selection Tips", downloaded on May 11, 2023 from [https://coatings.specialchem.com/selection-guide/corrosion-inhibitors-for-coatings], 16 pages.
"Side-pocket Mandrels", API Specification 19G1, 2019, 57 pages.
"Flow-control Devices for Side-pocket Mandrels", API Specification 19G2, 2020, 113 pages.
Search Report and Written Opinion of International Patent Application No. PCT/US2020/055713 dated Jul. 5, 2021, 10 pages.
International Preliminary Report on Patentability of International Patent Application No. PCT/US2020/055713 dated Apr. 27, 2023, 7 pages.
Extended Search Report issued in European Patent Application No. 20957884.8 dated Jun. 10, 2024, 11 pages.

* cited by examiner

US 12,467,814 B2

GRAPHENE-BASED ELECTRICAL CIRCUIT FLUID SYSTEM COMPONENT

CROSS REFERENCE TO RELATED APPLICATION

This application is a National Stage Entry of International Patent Application No. PCT/US2020/055713, filed on Oct. 15, 2020.

BACKGROUND

Various types of fluid system components can be utilized in fluid transport, fluid control, fluid operations, etc. For example, a pipe can be utilized for fluid transport, a valve can be utilized for fluid control, and a pump can be utilized for fluid operations. As an example, a reservoir can be a subterranean reservoir that includes fluid where various types of fluid system components may be utilized at the surface or below the surface (e.g., subsurface or subterranean). Where a borehole is drilled into a subterranean environment, which may include a reservoir, various types of fluid system components may be utilized at the surface of the borehole, if the borehole extends to the surface, and various types of fluid system components may be utilized downhole, for example, positioned in the borehole a depth or depths from the surface using one or more types of operations (e.g., rig, wireline, pump-down, etc.). In various environment (e.g., offshore, near shore, reservoir, etc.), one or more fluid system components may be exposed to water as a fluid at an exterior surface (e.g., fresh water, salt water, formation water, etc.) and fluid (e.g., water, oil, gas, etc.) at an interior surface.

SUMMARY

A fluid system component can include a support body that includes a surface; and an electrical circuit supported at least in part by the surface, where the electrical circuit includes graphene adjacent to a composite material that includes a polymer convertible to graphene, and where the electrical circuit generates a signal responsive to deformation of at least a portion of the electrical circuit.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

Figure 1:
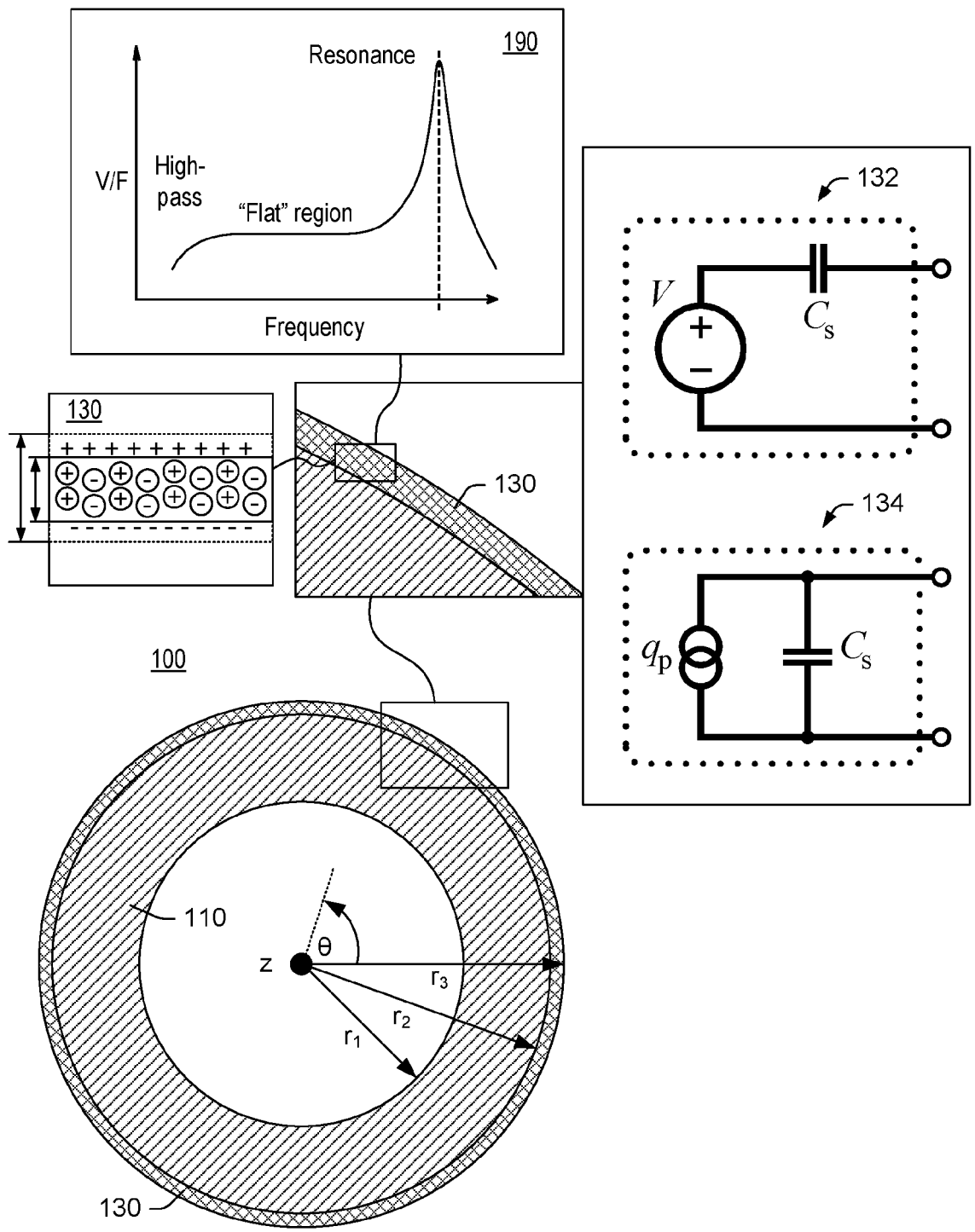
FIG. 1 illustrates an example of a fluid system component.

FIG. 1 shows an example of a fluid system component 100 that includes a support body 110 and a piezoelectric and graphene region 130 that forms at least a portion of an electric circuit. As mentioned, a fluid system can be a system of components that includes at least some components exposed to fluid directly and/or indirectly. Such fluid may be or include one or more of formation fluid, sea water, fresh water, oil, gas, drilling fluid (e.g., mud), etc. As an example, a fluid system component can be for a fluid handling system, which may be a fluid transport system. As an example, a fluid system component can be a component utilized in a downhole environment such as in a borehole, for example, to drill the borehole, treat the borehole, complete the borehole, generation of one or more fractures in a formation using the borehole, etc. As an example, a fluid system component may be exposed to fluid pressure, which may be via direct contact with fluid and/or indirect contact with fluid. As an example, a fluid system component may be exposed to fluid and be exposed to force from another source or sources. For example, consider rock adjacent to a fluid system component that applies force to the fluid system component (e.g., a tubular, a valve, etc.). As to one or more other types of force, consider force between components, force associated with degradation of a component, force associated with one or more types of scaling, etc.

In the example of FIG. 1, in the region 130, piezoelectric material is electrically coupled or may be electrically coupled to graphene circuitry. For example, the fluid system component 100 can be deployed with at least a portion of the piezoelectric material electrically coupled to graphene circuitry and/or with at least a portion of the piezoelectric material electrically decoupled from graphene circuitry. As to the former, a change in the fluid system component 100 may cause at least a portion of the piezoelectric material to become decoupled from the graphene circuitry and/or, as to the latter, a change in the fluid system component 100 may cause at least a portion of the piezoelectric material to become electrically coupled to the graphene circuitry. Where piezoelectric material is electrically coupled to graphene circuitry, the piezoelectric material may cause a change in potential, current, etc., in the graphene circuitry, for example, responsive to a change in the fluid system component. As an example, a change may be a change due to scaling, a change due to degradation, a change due to pressure, a change due to compression, a change due to tension, a change due to torque, etc.

FIG. 1 shows examples of circuits 132 and 134 that represent operational modes of piezoelectric material. As shown in FIG. 1, when a piezoelectric material of the piezoelectric and graphene region 130, which at least in part forms an electric circuit, experiences strain, charge distribution in the piezoelectric material can change such that, for example, one side becomes positively charged and the other side becomes negatively charged. As an example, output from a piezoelectric element can be a charge proportional to pressure where, for example, a charge amplifier may be utilized to convert the charge (e.g., charge signal) to a voltage (e.g., a voltage signal, etc.). As an example, a component may include one or more charge amplifiers that can provide one or more voltage outputs. In such an example, a power source may be utilized to supply power to the one or more charge amplifiers. As an example, in a charge-mode approach, a generated charge can be an output signal where, as desired, such an output signal may be converted to a voltage using a local and/or a remote charge amplifier. A piezoelectric sensor may be characterized as having a relatively high impedance output, which can make it sensitive to noise (e.g., caused by poor connections, cable movement, electromagnetic/RF interference, etc.). Where a charge amplifier is utilized, a low frequency response of a piezoelectric sensor can depend on the discharge time of the charge amplifier.

As explained, a piezoelectric material can be utilized to form at least part of a circuit that has a relatively high DC output impedance, which may be modeled as a proportional voltage source and filter network. In such an example, the voltage V at the source is directly proportional to the applied force, pressure, or strain experienced by the piezoelectric material. In such an example, the output signal can be related to such mechanical force as if it had passed through an equivalent circuit.

As shown in an example plot 190 of FIG. 1, a piezoelectric circuit can be modeled by its frequency response, which may be plotted as an output voltage over applied force versus frequency. A detailed model of a piezoelectric circuit can include effects of mechanical construction, non-idealities, etc. In such a circuit, inductance Lm can be due to seismic mass and inertia of the piezoelectric circuit itself. A capacitance, $C_e$, can be inversely proportional to the mechanical elasticity of the piezoelectric circuit and a capacitance, $C_0$, can represent the static capacitance of the piezoelectric circuit, resulting from an inertial mass of infinite size. A resistance, $R_i$, can be an insulation leakage resistance of the piezoelectric circuit's piezoelectric element. If such a piezoelectric circuit is connected to a load resistance, this can also act in parallel with the insulation resistance, both increasing the high-pass cutoff frequency.

As shown in the plot 190, a relatively flat region exists over a range of frequencies (e.g., a frequency band) that is greater than the high-pass cutoff frequency (e.g., cutting out low frequencies) and that is less than a resonant frequency. In the flat region, the piezoelectric circuit may be modeled as a voltage source in series with the piezoelectric circuit's capacitance as in the circuit 132 or as a charge source in parallel with the capacitance as in the circuit 134.

As an example, the piezoelectric and graphene region 130 may be configured to operate in the flat region of the frequency response plot (e.g., between the high-pass cutoff and the resonant peak). In such an example, a load and leakage resistance can be selected to be large enough such that low frequencies of interest are not lost. As an example, an equivalent circuit model can be used in this region, in which $C_s$ represents the capacitance of the piezoelectric circuit surface itself, which may be estimated by a standard formula for capacitance of parallel plates. As mentioned, it may also be modeled as a charge source in parallel with the source capacitance, with the charge directly proportional to the applied force.

As explained, the piezoelectric and graphene region 130 may operate to provide a voltage (e.g., a potential differential, etc.) and/or to provide a charge (e.g., a current, etc.). As an example, circuitry can be operatively coupled to the piezoelectric and graphene region 130 that can carry and/or measure voltage, current, etc. In such an example, the circuitry may be at least in part downhole circuitry, which may be operatively coupled to surface circuitry. As an example, circuitry can be operable downhole, for example, for downhole control of one or more operations and/or can be operable at surface, for example, for surface control of one or more operations.

As an example, a method can include making a fluid system component with a piezoelectric and graphene region. In such an example, the piezoelectric and graphene region may be suitable for applications that include oilfields, pressure/stress sensing, structural monitoring, flow measurements (e.g., via pressure monitoring, etc.), etc. As an example, a fluid system component may be a fracturing operation downhole component where a piezoelectric and graphene region can provide for real-time monitoring of one or more aspects of a fracturing operation (e.g., single stage, multi-stage, etc.). In such an example, pressure developed during fracturing can induce a signal via a piezoelectric and graphene region of a ball, dart, a seat, etc., which may be, for example, transmitted to surface to indicate zone isolation is established and fracturing occurs in a given zone. Additionally, or alternatively, disappearance of a signal may indicate zone communication and the end of a specific zone fracturing. As an example, a piezoelectric and graphene region may be used with a degradable component such as a ball, a dart, a receptacle (e.g., a seat, etc.), etc., which may be disposed downhole within a well (e.g., as part of a fracturing operation, etc.).

As an example, a fabrication method can include utilizing a spray and bake process where polymer, piezoelectric material, and a ceramic material in powder form may be suspended in a solution, such as water, and spray painted onto a surface, prior to drying, for instance in an oven. Another process may include a high velocity "cold" spray of piezoelectric, ceramic and polymer mixed powders. In such an example, the high kinetic energy cold spray process can deform polymer particles around piezoelectric ceramic particles deposited onto a selected fluid system component surface (e.g., in absence of polymer thermal decomposition, etc.). As an example, piezoelectric material may be selected from the lead zirconate titanate (PZT) family, for example, in doped condition with a high piezoelectric charge constant (d33).

As an example, a method for creating a composite piezoelectric coating (CPC) can include utilizing a carrier gas supply that feeds carrier gas to a gas controller (e.g., nitrogen, helium, air, or another inert gas). In such an example, the gas controller can separate the carrier gas into two separate streams and feed a first carrier gas stream to a heater and a second carrier gas stream to a powder feeder where, for example, flow rate of each carrier gas stream may be controlled independently. In such an example, the heater can heat the first carrier gas stream to a predetermined temperature which may be room temperature or an elevated temperature such as 100 degrees C. Once heated, the first carrier gas stream leaves the heater and can be fed to a supersonic nozzle while the powder feeder can entrain a powder in the second carrier gas stream.

As an example, a powder may be a combination of a piezoelectric material and a second material. As mentioned, piezoelectric material may be selected from the lead zirconate titanate family (e.g., soft piezoelectric for ultrasonic transmitter and receivers, and hard piezoelectric for high power acoustics). The modification of a base composition of lead zirconate titanate may be carried out, for example, by doping of lanthanum, niobium, iron nickel, etc. (e.g., one or more transition elements). As an example, a method can include selecting an additional material from one or more polymeric materials (e.g., polypropylene, polyimide, polytetrafluoroethylene, polyvinylidene fluoride (PVDF), P(VDF-tetrafluoroethylene), phenolics, epoxies, polyether ether ketone (PEEK), or polyether ketone (PEK), etc.). In such an example, a ceramic (e.g., one or more ceramic materials) may be included, for example, for mechanical reinforcement and/or pigmentation. As an example, a polymeric material may be of the polyaryletherketone (PAEK) family. As an example, a polymeric material may be a fluorinated ethylene propylene (FEP). As an example, a polymeric material may be a perfluoroalkoxy polymer resin (PFA). As an example, a polymeric material may be a fluoropolymer. As an example, a polymeric material may be a polyphenylene sulfide (PPS). As an example, a polymeric material may be a polyetherimide (PEI).

As another example, additionally or alternatively, a selected material may be a silicon based material (e.g., consider combining piezoelectric thin films with micromachined silicon membranes). As an example, a ratio of piezoelectric material to an additional material or materials in a powder may be controlled as part of a manufacturing process. As to powder characteristics, consider, for example, powder that may have an average particle size between approximately 0.001 mm and approximately 0.1 mm. A silicon based material may be utilized with a polymeric material where the polymeric material can be used to generate graphene (e.g., graphene as one or more conductors).

As an example, a method can entrain powder in a gas stream where the powder and the gas exit a powder feeder that feeds a supersonic nozzle unit, which may receive another gas such that the gases and powder are combined and ejected at relatively high velocity from the supersonic nozzle (e.g., consider a range from approximately 10 m/s to approximately 1200 m/s). The ejected mixture may be directed at a target, which may be a support body of a fluid system component, etc. (e.g., a tool, degradable component, ball, seat, dart, flow control valve, multi-cycle valve, cylindrical tool, part of a transducer or sensor, etc.). Upon impacting the target, the powder entrained in the stream can be consolidated into a CPC (e.g., by kinetic energy of the impact).

As an example, powder temperature before, during, and after consolidation may be kept below the powder's melting point. Upon impact, kinetic energy of the powder can compress the powder, which can act to reduce voids. As an example, a CPC can include a percolated matrix of piezoelectric material that is encapsulated by another material or materials. U.S. Pat. No. 10,156,490, to Singh et al., issued 18 Dec. 2018, entitled "Piezoelectric coatings for downhole sensing and monitoring", which is incorporated by reference herein, describes various CPC techniques.

A CPC may be deposited over a desired area or areas of a fluid system component where one or more of such areas may be sensitive to changes in pressure. For example, a CPC may be disposed over a large enough area to sense multiple pressures within a well.

Mixtures of piezoelectric material, ceramic, and polymers may be deposited over a desired area or areas of a fluid system component where one or more of such areas may be sensitive to changes in pressure. For example, such mixtures may be disposed over a large enough area to sense multiple pressures within a well.

Referring again to FIG. 1, the piezoelectric and graphene region 130 may be subjected to pressure from one side or more than one side. In the graphic illustrating distribution of charges, pressure may cause a decrease in a dimension of the piezoelectric and graphene region 130, which, as explained, can generate a signal (e.g., charge, etc.).

As an example, where a fluid system component is at least in part degradable, one or more effects may impact a piezoelectric and graphene region, which may be detectable via a signal or signals (e.g., or lack thereof, etc.).

As an example, where scale forms on a fluid system component, the scale may alter responsiveness of a piezoelectric and graphene region. For example, such a region may become stiffer and hence experience less strain for a given amount of pressure (e.g., fluid pressure, etc.).

While the fluid system component 100 of FIG. 1 shows the piezoelectric and graphene region 130 being at an outer perimeter, a fluid system component may, alternatively or additionally, include one or more other piezoelectric and graphene regions. For example, consider one or more piezoelectric and graphene regions at the inner perimeter of the support body 110 and/or one or more piezoelectric and graphene regions between the inner perimeter and the outer perimeter of the support body. In one or more of such examples, multiple measurements may be made, which can allow for differentials to be computed or otherwise measured using circuitry. As an example, consider a nulling approach where inner perimeter and outer perimeter pressures offset each other to null a signal and, where they do not offset each other, generate a signal. In such an example, circuitry can be utilized to provide a desired null point, which may be for a ratio of signals that may be 1:1 and/or other than 1:1. As an example, a signal may be a signal that is generated by multiple piezoelectric and graphene regions and/or one or more piezoelectric and graphene regions and another type of circuitry (e.g., piezoelectric without graphene, etc.). As an example, circuitry (see, e.g., the circuits 132 and 134, etc.) may be combined with other circuitry, which may be operatively coupled to or part of one or more other types of sensors. As an example, a combined signal can include one or more piezoelectric and graphene sensor signals. As an example, a combined signal can be homogeneous or can be heterogeneous, depending on sensor types.

As mentioned, in various environments (e.g., offshore, near shore, reservoir, etc.), one or more fluid system components may be exposed to water as a fluid at an exterior surface (e.g., fresh water, salt water, formation water, etc.) and fluid (e.g., water, oil, gas, etc.) at an interior surface. In such examples, a fluid system component can include multiple piezoelectric regions, which can include one or more piezoelectric and graphene regions. In such examples, electrical circuits may be independent or combined in that they can be electrically coupled.

As an example, where a fluid system component degrades, it may include one or more piezoelectric and graphene regions that degrade or not. As an example, a support body may degrade in part such that two or more piezoelectric and graphene regions come into electrical contact, which may provide a corresponding signal that is indicative of such contact (e.g., inferring degradation of at least a portion of the support body). While such an example, refers to a single fluid system component, an assembly of fluid system components may provide for contact sensing using one or more piezoelectric and graphene regions, whether one or more of the fluid system components is degradable or not degradable. As an example, contact sensing may provide for one or more of contact and non-contact sensing. For example, consider a single signal turning into two signals or vice versa depending on state of contact (e.g., non-contact or contact).

In various instances, contact force may be determined using one or more piezoelectric and graphene regions. For example, consider two of such regions in contact for two fluid system components. In such an example, two separate and independent signals may be provided that may optionally be compared to determine status of one or more of the regions. For example, if one of the fluid system components is degradable, its signal may degrade where the piezoelectric and graphene region of that fluid system component is degradable, whether directly and/or indirectly (e.g., as being supported on a support body that may be degradable, etc.).

As explained, one or more signals can be utilized for monitoring, control, etc., of one or more fluid system operations, which may be surface fluid system operations and/or subsurface fluid system operations where a subsurface fluid system operation may be below a water surface (e.g., sub-sea, etc.). As an example, a fluid system operation may be a marine-based fluid system operation, which may involve use of a vessel, an offshore structure, etc.

Figure 2:
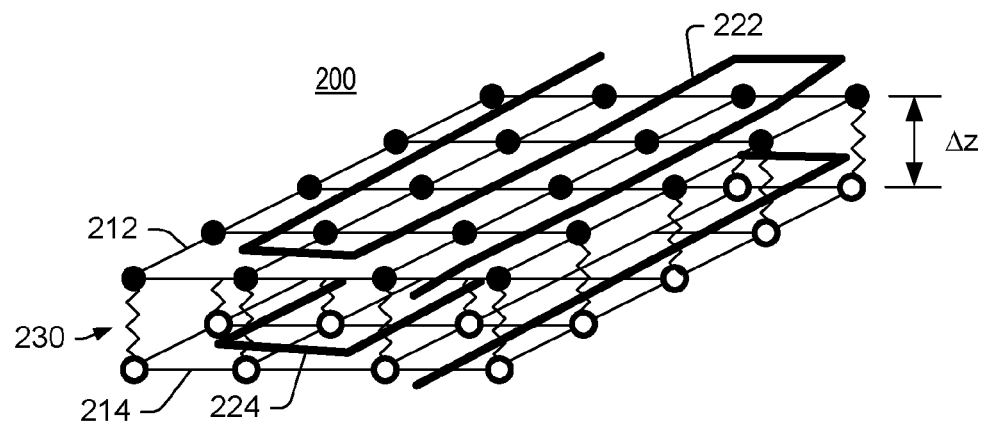
FIG. 2 illustrates an example of a composite material and an example of a plot.
Figure 2:
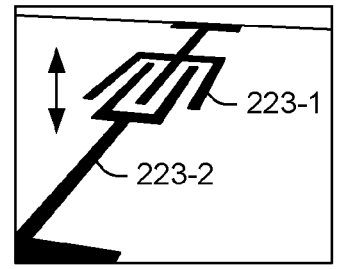
Figure 2:
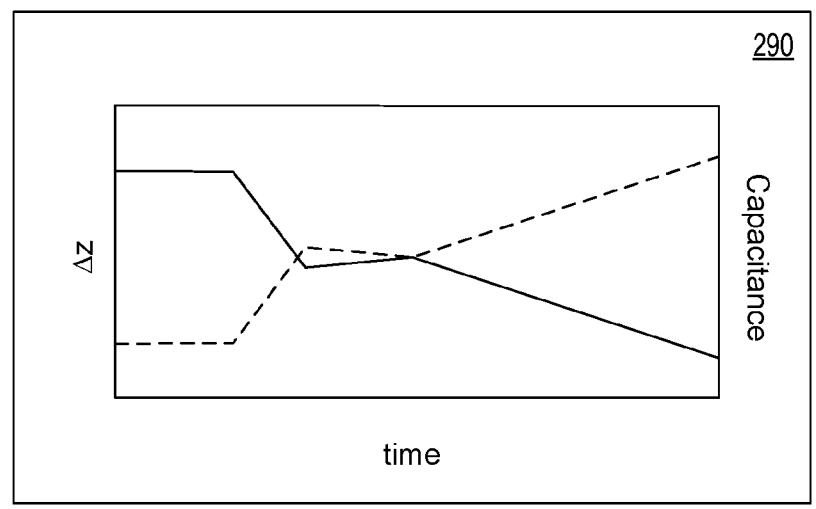

FIG. 2 shows an example of a composite material 200 that can include multiple layers 212 and 214 where the multiple layers 212 and 214 can be spaced apart, for example, by a dimension $\Delta z$, where the dimension can change in response to force. As shown, the layer 212 can include a conductor 222 and the layer 214 can include a conductor 224 where capacitance can be measured between the conductors 222 and 224 as a function of the dimension $\Delta z$. As shown in an example plot 290, as the dimension $\Delta z$ changes with respect to time, the capacitance of the composite material 200 can change.

FIG. 2 also shows an arrangement with two conductors 223-1 and 223-2 that may be part of a common layer (e.g., consider the layer 212 or the layer 214). In such an example, where the layer can deform, the relative positions of the patterns of the conductors 223-1 and 223-2 can change.

In the example of FIG. 2, at least one of the conductors 222, 223-1, 223-2, and 224 can include graphene. For example, the layer 212 may include a material that can form graphene as a conductor and/or the layer 214 may include a material that can form graphene as a conductor.

As shown in the example of FIG. 2, the layers 212 and 214 can define a space that includes a material 230, which may be or may include piezoelectric material. For example, as the dimension $\Delta z$ changes, charge distribution in the material 230 may change. Thus, the composite material 200 can include two different techniques for measuring force (e.g., pressure, etc.) where one technique depends on capacitance and the other technique depends on the piezoelectric effect. In such an example, one or more of the conductors 222 and 224 may be electrically coupled to piezoelectric material. In such an example, charge may be carried and/or induced in at least one of the conductors 222 and 224 via the piezoelectric effect (see, e.g., FIG. 1).

As an example, a piezoelectric effect may generate charge that can flow in one or more circuits that itself includes a deformable conductive portion. For example, pressure can cause piezoelectric material to generate charge that can flow in a graphene conductor, which may be in a circuit that can measure charge, voltage, capacitance, resistance, etc. As explained, charge and voltage or capacitance can be utilized to measure strain in a material or materials.

As an example, a piezoelectric material subjected to force that can be utilized to generate an oscillatory signal (e.g., drive an oscillation circuit, etc.) where the oscillatory signal can be utilized for characterizing capacitance such as between two conductors, which may be or include graphene conductors. In such an example, charge may increase with an increase in force applied to the piezoelectric material where such force may decrease spacing between conductors such that the oscillatory signal changes in a manner dependent on capacitance between the conductors where, for example, the frequency decreases responsive to an increase in capacitance (e.g., a decrease in spacing such as may be defined by $\Delta z$).

In the example of FIG. 2, the material 230 may be a type of material that can be characterized by its electrical properties. For example, consider one or more of the different types of dielectric classifications: dielectric, piezoelectric, pyroelectric or ferroelectric. As an example, the material 230 may be made of multiple materials (e.g., layered, interwoven, distributed, etc.).

Figure 3:
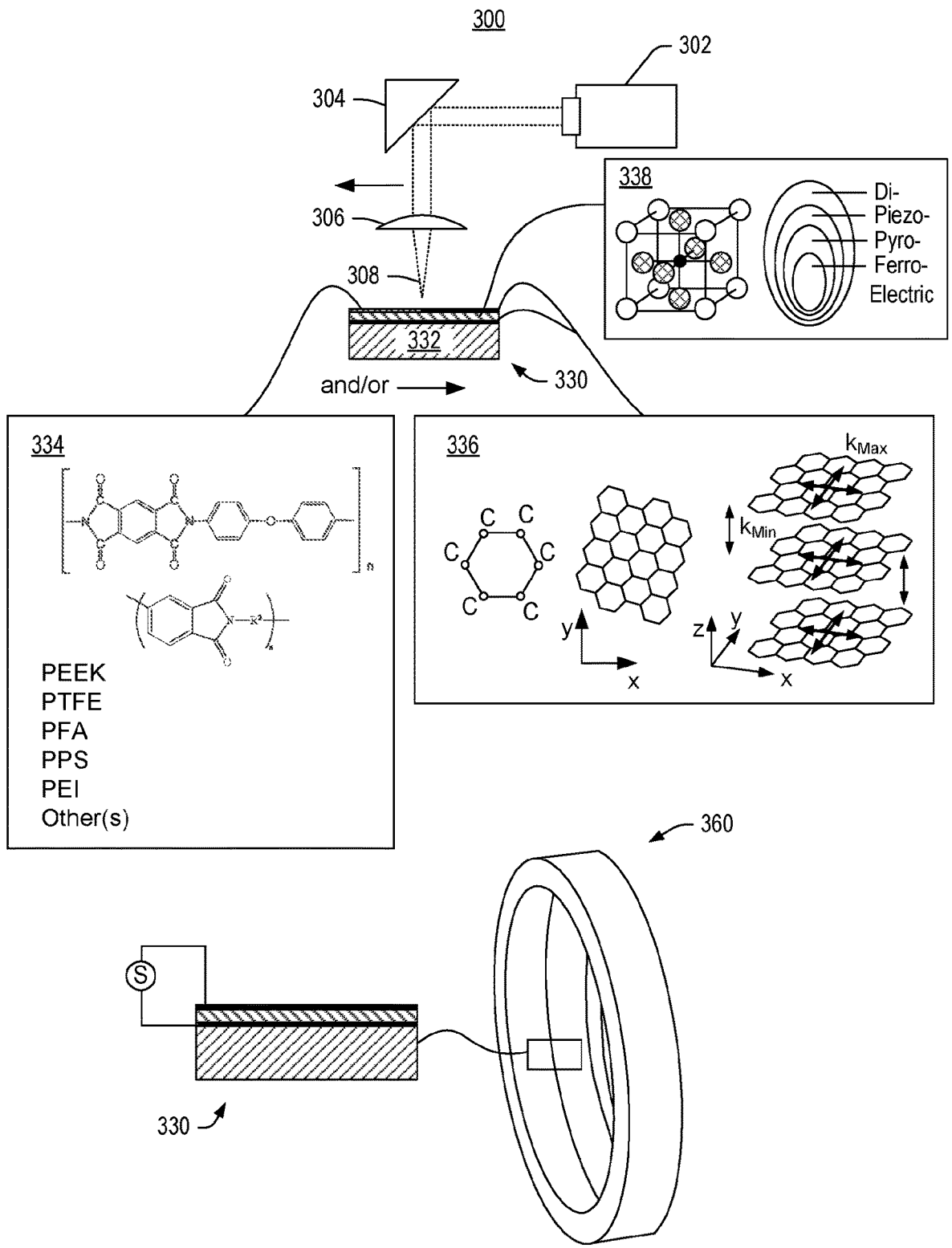
FIG. 3 illustrates an example of a system for making an example of a composite and an example of a fluid system component.

FIG. 3 shows an example of a system 300 that can be utilized to manufacture at least a portion of a component 360. As shown, the system 300 includes an electromagnetic (EM) energy generator 302, which may be a laser, an electron beam generator, a plasma generator, etc. Where the EM energy generator 302 generates a beam, the beam may be directed using one or more elements. For example, for a laser, consider a mirror 304 and a lens 306 where the lens 306 can focus a beam 308 onto a material 334 as part of a composite 330 for conversion of the material 334 to graphene 336. In such an example, the composite 330 can include a support body 332 that can support one or more other materials (e.g., the material 334, the graphene 336, dielectric material 338, etc.).

In the example of FIG. 3, the material 334 may be or may include polyimide and/or one or more other polymers. In FIG. 3, some example structures of aromatic polyimide are shown where aromatic rings are present in units that are repeated. As explained, one or more materials (e.g., the material 334, etc.) can be converted at least in part to graphene, some example structural features thereof being illustrated in FIG. 3. For example, graphene includes carbon rings that can form substantially planar sheets where sheets may optionally be formed as stacked sheets. When stacked, properties may differ depending on orientation. For example, heat conductivity may differ for in-plane and inter-plane directions where in-plane heat conductivity ($k_{Max}$) is greater than inter-plane heat conductivity ($k_{Min}$).

In graphene, carbon atoms may be arranged in a hexagonal manner, due to sp2 bonding, as a crystalline allotrope of carbon (e.g., as a large aromatic molecule). Graphene may be described as being a one-atom thick layer of graphite and may be a basic structural element of carbon allotropes such as, for example, graphite, charcoal, carbon nanotubes and fullerenes. In FIG. 3, the illustrations for the material 334 show a carbon ring along with a layer of graphene and layers of graphene, which may be described, for example, with respect to a Cartesian coordinate system (x, y, z).

Graphene can be characterized as a zero-overlap semi-metal (with both holes and electrons as charge carriers) with very high electrical conductivity. Carbon atoms have a total of 6 electrons; 2 in the inner shell and 4 in the outer shell. The 4 outer shell electrons in an individual carbon atom can be available for chemical bonding, but in graphene, each atom is connected to 3 other carbon atoms on the two dimensional plane, leaving 1 electron freely available in the third dimension for electronic conduction. These highly-mobile electrons are called pi ($\pi$) electrons and are located above and below a graphene sheet. These pi orbitals overlap and help to enhance the carbon to carbon bonds in graphene. Fundamentally, the electronic properties of graphene are dictated by the bonding and anti-bonding (the valance and conduction bands) of these pi orbitals.

As to the material 334, it may be a polymeric material that may be an electrical insulator. As an example, a polymeric material can be a dielectric material that is an electrical insulator. A dielectric material or dielectric is an electrical insulator that can be polarized by an applied electric field.

In the example of FIG. 3, the material 334 may be or may include one or more polymers (e.g., polymeric materials), including one or more of the materials shown, which can include one or more of polyimide (PI), PEEK, PTFE, PFA, PPS, PEI, and one or more other polymers.

PEEK tends to exhibit high resistant to downhole environments and can be readily sprayed onto a metallic surface. PEEK may also be used in one or more types of coatings, which may optionally include one or more ceramics to tailor physical properties. For example, a ceramic may be included in a composite material with one or more polymers to provide a harder and more abrasion resistant component. As to types of ceramics, consider one or more ceramic pigments such as titania, cobalt or nickel oxides, etc. Through inclusion of a ceramic, a color of a resulting composite material may be adjusted. As an example, with PTFE addition or boron nitride ceramic, lubricity of a composite material may be reduced.

As mentioned, a polymeric material can be a polyimide. Polyimides (PI) are high-performance polymers of imide monomers that include two acyl groups (C=O) bonded to nitrogen (N). PIs can exhibit high temperature performance, for example, in a range of 400 degrees C. to 500 degrees C. PIs can also be resistant to various chemicals.

Polyimides can exist as thermosetting PIs and as thermoplastic PIs. Depending upon the constitution of their main chain, PIs can be classified as aliphatic, aromatics, semi-aromatics thermoplastics and thermosets. Aromatic polyimides may be derived from an aromatic dianhydride and diamine. Semi-aromatic ones can include one or more monomer aromatics (e.g., dianhydride or diamine is aromatic, and another part is aliphatic). Aliphatic polyimides can include polymers formed as a result of the combination of aliphatic dianhydride and diamine.

Various PIs are infusible and insoluble due to their planar aromatic and hetero-aromatic structures and thus, where desired, may be processed from a solvent route.

As an example, a polymeric material can be characterized at least in part by a dielectric constant. For example, KAPTON™ polyimide film (marketed by E. I. Du Pont de Nemours and Company, Wilmington, Delaware) can be characterized by a dielectric constant that can depend on humidity where the dielectric constant increases with respect to increasing relative humidity (RH), for example, from about 3 to about 4 for an increase from about 0 percent RH to about 100 percent RH (e.g., for a 1 mil film of KAPTON® type HN polymer). Such water-related changes in properties are due to polyimide films being formed by condensation reactions. Polyimide, when exposed to water, can degrade via hydrolytic attack. The kinetics of hydrolytic degradation can depend on temperature and pressure as well as, for example, presence of other constituents in an environment.

As an example, a polyimide may be converted to graphene where graphene is more robust in that it does not experience hydrolytic degradation as does polyimide. Where graphene is formed in a layer of polyimide, it may be adjacent to polyimide, optionally in a manner supported by polyimide. As an example, where water exposure occurs, such water may be utilized beneficially to degrade polyimide via hydrolytic attack in a manner that degrades support for graphene. In such an example, where an electrical circuit that includes graphene is degraded, that may operate as a signal as to status of a fluid system component.

As an example, where a fluid system component may be in an aqueous environment where water may reach polyimide, one or more barrier materials may be utilized to protect the polyimide from hydrolytic attack. For example, a lead (Pb) or bismuth (Bi) layer can be a barrier layer that acts to protect polyimide. For example, a lead (Pb) layer can reduce permeation of water, $H_2S$, $CO_2$ or one or more other constituents that can degrade polyimide and/or otherwise impact its dielectric properties (e.g., ability to insulate a conductor, which may be a graphene conductor or another type of conductor). While lead (Pb) and bismuth (Bi) are mentioned as examples of types of barrier material, one or more other types of barrier materials may be utilized, which may be, for example, one or more of metallic material, ceramic material, and polymeric material.

As to the material 338, a schematic of a crystalline structure is illustrated, which may be a PZT type of crystalline structure (e.g., a piezoelectric crystalline structure). As an example, one or more PZT layers (e.g., films, etc.) may be integrated into a fluid system component for use as part of a sensor, an actuator, a filter, a transducer, etc. As an example, a relatively thick, dense, and crack-free piezoelectric layer (e.g., greater than 10 m) with good piezoelectric and dielectric properties may be utilized to produce generative forces with relatively fast response speeds.

In FIG. 3, the example fluid system component 360 may be of a particular shape where a portion thereof includes the composite 330, which may be utilized for generating a signal. For example, consider graphene conductors that can change spatially in response to pressure, degradation of material, exposure to one or more chemicals (e.g., water, etc.), etc.

As an example, a signal generated by the composite 330 as part of the fluid system component 360 may operate locally and/or remotely. For example, a signal may be provided to local circuitry (e.g., to a local monitor, a local controller, etc.) a signal may be transmitted via one or more techniques to a remote location (e.g., to a remote monitor, to a remote controller, etc.). As an example, a signal may act as a trigger, for example, to release a chemical, release an electrical charge, etc. Where a fluid system component includes one or more degradable portions, a trigger may act to initiate and/or expedite degradation (e.g., via chemical release, electrical charge release, etc.). As to a chemical, consider an acid or a base that may attack a type of bond of material of a degradable component. As to an electrical charge, consider a charge that may be from a capacitor or other storage device (e.g., battery, etc.), which may cause degradation of one or more types of bonds (e.g., directly, via resistive heating, inductive heating, etc.).

As an example, a signal may trigger an anti-scaling process. For example, consider the composite 330 as being exposed to effects of scale formation on the fluid system component 360. In such an example, the composite 330 may respond by generating a signal that can trigger release of energy, one or more chemicals, etc., that can act to reduce scale, reduce scale formation, etc.

Scale can be a deposit or coating formed on a surface of material, which may be a metallic material, rock, etc. Scale can be caused by one or more processes. For example, consider one or more of precipitation due to a chemical reaction with a surface of material, precipitation caused by one or more chemical reactions, a change in pressure, a change in temperature, a change in composition of a solution, etc. As an example, scale may be formed via a corrosion process. As to types of chemicals that may form or be in scale, consider one or more of calcium carbonate, calcium sulfate, barium sulfate, strontium sulfate, iron sulfide, iron oxides, iron carbonate, various silicates and phosphates and oxides, various compounds insoluble or slightly soluble in water, etc.

As an example, scale can be a mineral salt deposit that may occur on tubing or other components as saturation of produced water is affected by changing conditions. Scale may create a restriction, or even a plug, in tubing. As to removal of scale, various types of mechanical, chemical and/or scale inhibitor treatment options may be available.

As to how scale may affect the composite 330, consider a reduction in pressure from fluid flowing past a surface of the fluid system component 360 as scale may be relatively rigid and hinder deformation of material in the composite 330. For example, as scale adheres and builds on such a surface, the scale may have a Young's modulus (e.g., elasticity modulus) that is large such that the effect of fluid pressure on a deformable material is reduced and hence a pressure-based signal is reduced (e.g., as from a piezoelectric material, spatial arrangement of graphene conductors, etc.).

As explained, a fluid system component can include one or more graphene conductors, which may be formed using an EM energy generator that can convert a material to graphene. In various examples, a material can be or can include one or more polymers that can be converted to graphene where the graphene can be utilized as an electrical conductor. Such graphene may itself be utilized for signal generation responsive to deformation and/or such graphene may be utilized for carrying a signal in relationship to a material such as a piezoelectric material (e.g., a piezo ceramic, etc.).

As an example, a fluid system component can include a piezoelectric and graphene region (e.g., optionally as layered coatings) where a method of manufacture can, for example, utilize polymer spray coatings, combined with localized thermal scans (e.g. laser, e-beam, micro plasmas, etc.) to form conductive graphene (e.g., conductive patterns of graphene). As to the fluid system component, it may include a support body where a method of manufacture can include, for example, application of one or more coatings to one or more surfaces of the support body. In such an example, the fluid system component may be a flow conduit with pressure/stress sensing and monitoring (prognostic health monitoring) capabilities. As mentioned, as an example, a fluid system component may include scale deposition monitoring capabilities. As an example, a fluid system component may include a skin polymer that may be, for example, one or more of PEEK, PEK, PTFE, PEI, PPS, PFA, etc.; a piezoelectric material that may be selected from the lead zirconate titanate (PZT) family; graphene, which may be produced after depositing polymer and/or a polymer-ceramic layer, where the graphene can be utilized as part of an electrical circuit. For example, graphene may form a continuous electrically conductive or electrode path (e.g., ranging from a simple line to complex and interconnected geometric patterns, such as strain gauge, RFID like, etc.).

As explained with respect to the example fluid system component 360 of FIG. 3, the composite 330 can transform equipment (e.g., valves, actuators, sealing devices, etc.) into "smart" equipment, for example, with one or more abilities to sense and report stress (pressure), strains (displacement), degradation, etc. For example, when applied to oilfield scales, the composite 330 may sense and monitor hydrostatic pressure changes (e.g., heavy scaling resulting in reduced flow cross-section) and/or scale-adhesion induced stresses (e.g., scaling attaching to the sensing skin will impact its flexibility, translating into electrical changes).

As an example, the composite 330 of FIG. 3 may be a skin that may be characterized as being "smart" due to its capabilities of generating an electrical, measurable response to an external stimulus (e.g., mechanical, hydraulic, degradative, etc.). For example, force may cause one or more changes in strain in a smart skin where the smart skin produces an electrical response (e.g., a current, a voltage, an impedance, etc.).

As an example, a fluid system component can include a layered sensing skin (e.g., with ability to generate an electrical response) where the sensing skin is applied to one or more surfaces of the fluid system component (e.g., a structural component). For example, a fluid system component can include one or more surfaces that define one or more passages for fluid, for contact with another component, etc. As an example, a fluid system component may include a shape that is cylindrical, hollow, etc.

As an example, a composite that can be included in a fluid system component can include: one or more polymers (PEEK, PEK, PTFE, PFA, PPS, PEI, etc.), optionally in continuous and interconnected form; one or more piezoelectric materials (e.g., PZT family), which may be in discontinuous form (e.g., powder impregnations, etc.) and in isolated form; and lines of graphene-rich electrodes, intrinsically electrically conductive, which may be produced by localized thermal sources.

Referring again to FIG. 1, the piezoelectric and graphene region 130 may be a smart sensing skin positioned on an outer diameter surface (OD) or, for example, may be on an internal surface (e.g., ID). In such an example, two or more layers may be utilized where one layer may be an electrically insulating (e.g., dielectric) layer deposited onto a metallic surface where another layer is stimuli-responsive to generate a detectable (e.g., measurable) electrical influx. As an example, a top layer or top coat may be included to protect one or more other layers. As mentioned, where a layer includes a suitable polymer, where a portion thereof may be converted to graphene, a barrier material may optionally be utilized, as desired (e.g., for hindering intrusion of water, which may hydrolytically attack polyimide, etc.).

As explained with respect to FIG. 3, one or more polymers may be utilized, which may include one or more of PI, PEEK, PTFE, PFA, PPS, PEI and one or more other polymers. In such an example, one or more of the polymers may be converted at least in part to graphene.

Figure 4:
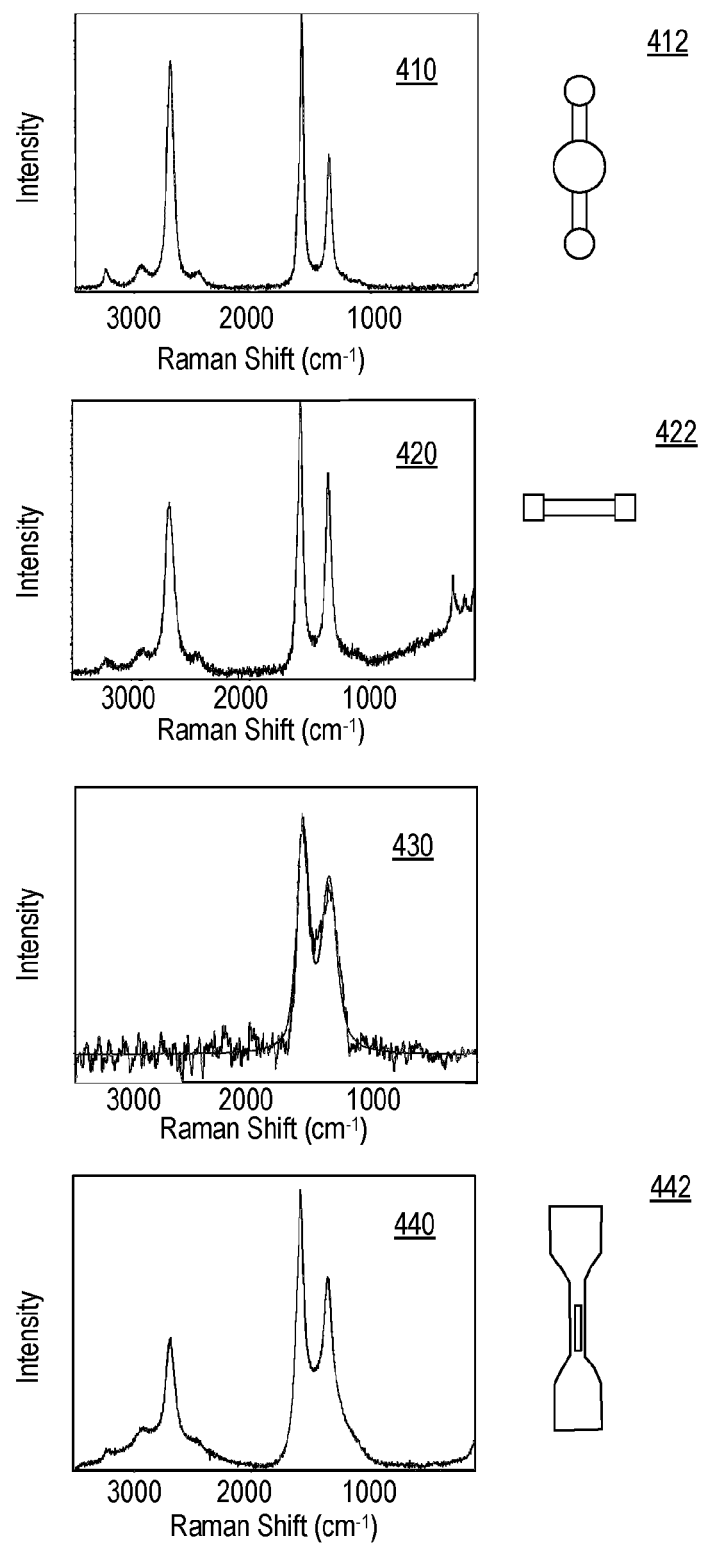
FIG. 4 illustrates Raman spectrograms and some examples of components.

FIG. 4 shows examples of Raman spectrograms 410, 420, 430 and 440 for some examples of materials that can be converted to graphene. FIG. 4 also shows some example structures 412, 422 and 442 that may be formed using a material convertible to graphene. Raman spectroscopy can be utilized as a non-destructive chemical analysis technique to provide information about chemical structure, phase and polymorphy, crystallinity and molecular interactions. A Raman spectrum (or Raman spectrograph) is based upon the interaction of light with the chemical bonds within a material. A Raman spectrum can feature a number of peaks, showing the intensity and wavelength position of the Raman scattered light. In such a spectrum, each peak can correspond to a specific molecular bond vibration, including individual bonds such as C—C, C═C, N—O, C—H etc., and groups of bonds such as benzene ring breathing mode, polymer chain vibrations, lattice modes, etc.

Raman spectroscopy can be utilized to identify and characterize graphene. For example, Raman spectroscopy may be used to determine the number and orientation of layers, the quality and types of edge, and the effects of perturbations, such as electric and magnetic fields, strain, doping, disorder and functional groups. Such an approach may provide insight into $sp^2$-bonded carbon allotropes, because graphene is their fundamental building block.

In graphene, the Stokes phonon energy shift caused by laser excitation creates two main peaks in the Raman spectrum: G (1580 $cm^{-1}$), a primary in-plane vibrational mode, and 2D (2690 $cm^{-1}$), a second-order overtone of a different inplane vibration, D (1350 $cm^{-1}$). In a spectrograph, D and 2D peak positions can be dispersive (e.g., dependent on the laser excitation energy). The foregoing positions cited are from a 532 nm excitation laser.

Referring again to the spectrographs 410, 420, 430 and 440 of FIG. 4, the spectrograph 410 corresponds to graphene generated from PEEK (e.g., applied to a substrate as a spray coating), the spectrograph 420 corresponds to graphene generated from PEEK/PPS-PFA (e.g., applied as a ceramic spray coating), the spectrograph 430 corresponds to graphene generated by PPS-PTFE (e.g., applied as a ceramic spray coating), and the spectrograph 440 corresponds to graphene generated by PEI (e.g., as deposited using an additive manufacturing technique).

As an example, one or more members of the PAEK family may be utilized to form a structure (e.g., as a coating, as a matrix, etc.). PEEK is within the PAEK family and is a semi-crystalline thermoplastic with a linear aromatic polymer structure where recyclable material melts at 343 degrees C. PEEK possesses mechanical properties with resistance to chemicals, wear, fatigue and creep even at relatively high operating temperatures. PEEK also has low moisture absorption, stable dielectric (insulating) properties and inherently low flammability. Processing options include injection molding, compression molding, and extrusion into shapes, film or fibers, to thermoforming, spray coating, or stock shape machining.

As an example, PEEK, alone or as a mixture, can be utilized for additive manufacturing (e.g., 3D printing, etc.). For example, consider an extruder that can operate with a temperature in excess of the melting temperature of PEEK. As an example, a method can include depositing PEEK on to a substrate, which may be a composite structure, where the substrate may be heated to a temperature that is suitable for deposited PEEK (e.g., for forming, control of solidification, etc.).

As an example, a fluid system component may be made at least in part of a polymer such as PEEK. For example, in some instances, PEEK can substitute for metal (e.g., metal, alloy, etc.). In such an example, carbon fibers, glass fibers, etc., may be included as structural reinforcements to provide strength and modulus properties akin to those of aluminum with a density that is lower than aluminum such that strength-to-weight ratio is increased compared to use of metal.

As mentioned, PI can be sensitive to water as hydrolytic attack may be possible depending on conditions. As an example, where water exposure is possible, a material other than PI may be utilized as a material that can be converted at least in part to graphene. As explained, various polymers possess particular properties that can differ. In various examples, a polymeric material may be selected as a pure, a mixture, etc., of one or more materials.

Figure 5:
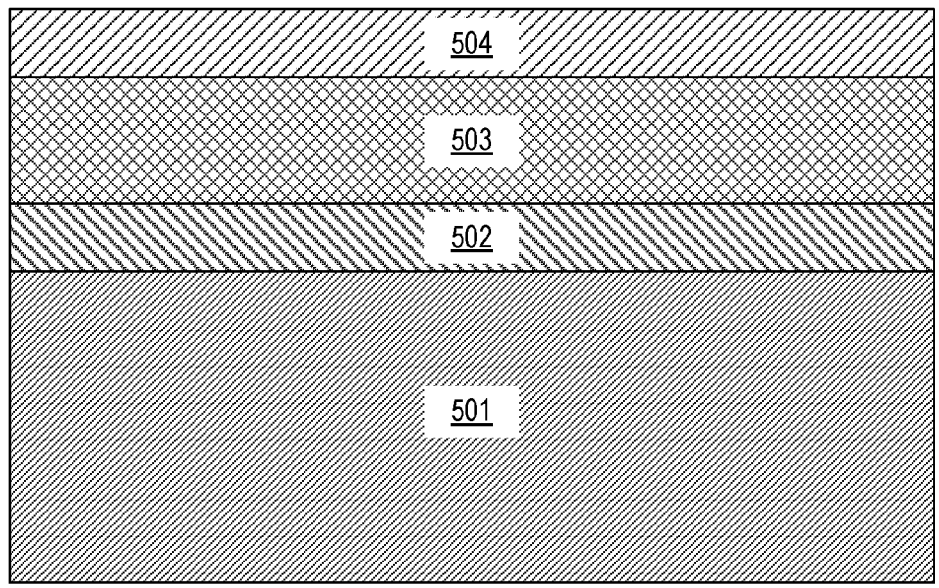
FIG. 5 illustrates an example of a composite and some examples of graphene patterns.
Figure 5:
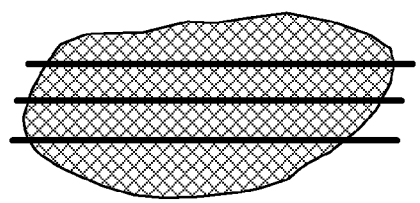
Figure 5:
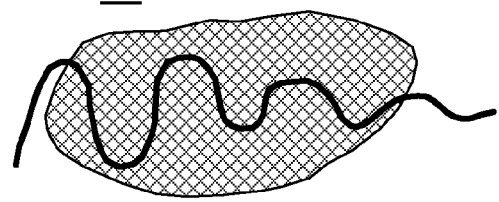
Figure 5:
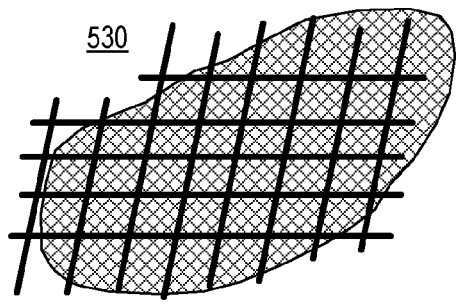
Figure 5:
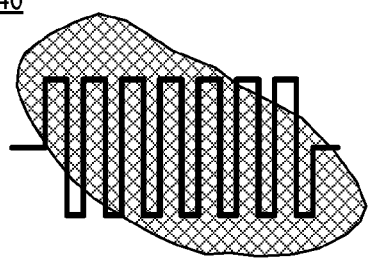

FIG. 5 shows an example of a composite 500 that includes a substrate 501, which may be a support body, an underlayer 502 that can be utilized as an insulator to electrically insulate one or more other layers from the substrate 501 where the substrate 501 is electrically conductive, a piezoelectric and graphene region 503, and a protective layer 504.

As mentioned, one or more portions of the composite 500 may be degradable. As an example, where the underlayer 502 is degraded, the degradation may result in electrical contact with the substrate 501, which may be utilized in a beneficial manner, if desired. For example, electrical contact may cause a signal to occur or may cause a signal to cease, either of which may be measurable for a particular purpose or purposes. As mentioned, where a polyimide is utilized as an electrical insulator, it may degrade upon exposure to water via hydrolytic attack. Where a portion of the polyimide has been converted to graphene, the graphene may become mechanically and/or electrically conductively unstable, which may alter and/or generate a signal. While polyimide is mentioned, one or more other polymeric materials (e.g., optionally polymeric composite materials) may be utilized, which may optionally be formulated for degradation or not in particular conditions.

As an example, a composite may include one or more of PTFE, FEP, and PFA, and/or one or more non-polymers such as, for example, disulfides ($MoS_2$), nitrides (BN), graphite (C), and/or one or more other solid lubricants (e.g., as may be included for specific lubrication purposes).

As an example, a composite may include one or more corrosion inhibitors (e.g., metals such as aluminum, ionic compounds such as phosphates, molybdates) that may optionally be added for purposes of improving corrosion protection. For example, such materials may help to protect one or more other materials from corrosion (e.g., by hindering corrosive chemical reactions, etc.).

FIG. 5 shows an example of a composite 500 that includes a substrate 501, which may be a support body, an underlayer 502 that can be utilized as an insulator (e.g., insulator layer) to electrically insulate one or more other layers from the substrate 501 where the substrate 501 is electrically conductive, a composite layer 503 including a piezoelectric and graphene region, and a protective layer 504.

Figure 6:
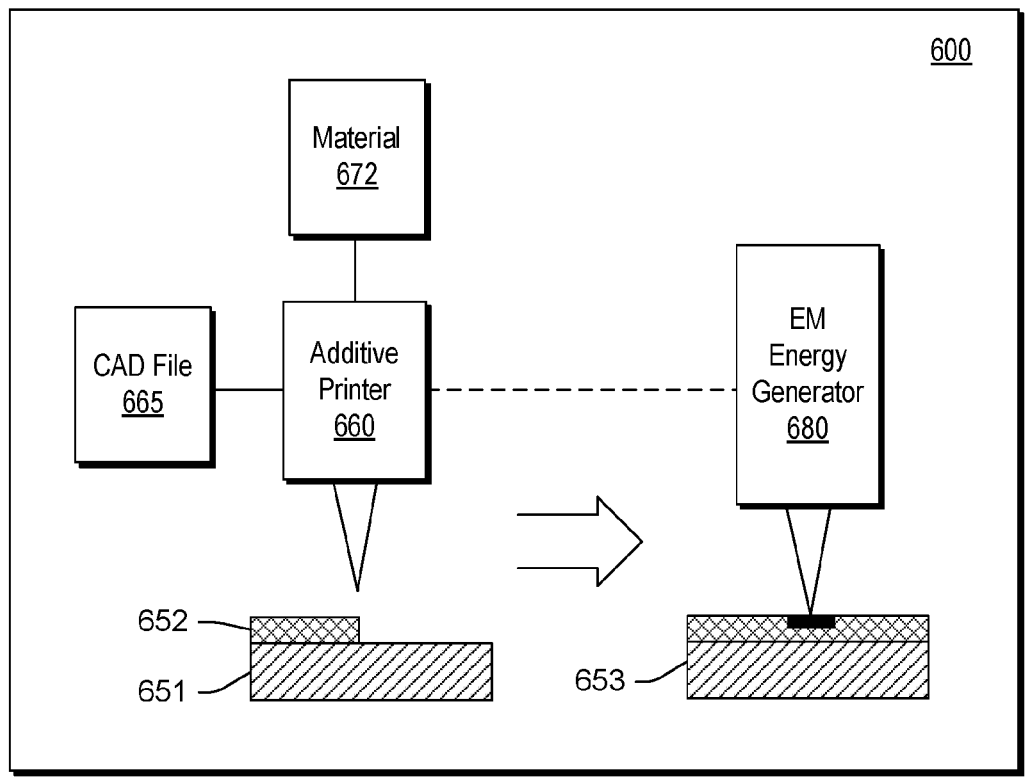
FIG. 6 illustrates an example of a method with respect to an example of a system.

FIG. 6 shows an example of a method 600 that includes depositing material 672 using an additive printer 660 onto a substrate 651 to form a layer 652 of the material 672, which may be spatially deposited according to instructions in a computer-aided design (CAD) file 665 (e.g., STL file, etc.), where an EM energy generator 680 can emit energy to convert at least a portion of the material 672 of the layer 652 into graphene to produce a composite 653. As an example, the CAD file 665 may be or include an STL file that includes STL types of instructions, etc. An STL file can include a triangulated representation of a multidimensional model, which may be a CAD model. In the example of FIG. 6, the CAD file 665 may include instructions that can instruct the EM energy generator 680 (e.g., and/or a gantry, etc., that can move the substrate 651 with the layer 652). As an example, an assembly may include a dual head for additive printing and for EM energy generation. For example, consider a dual head that can be controlled such that material can be deposited and at least a portion of the deposited material converted into graphene (e.g., in a desired pattern, etc.).

As an example, a method of manufacture may include installing and/or forming one or more electrodes, which may be in the form of an array from which an electrical change can be monitored to determine a strain (e.g., from pressure and/or stresses). As an example, a medium between electrodes can be a dielectric material (e.g., with a capacitance) that may be continuous and/or discontinuous. As an example, consider a material characterized as being a discontinuous composite made of piezoelectric materials such as particles and/or fibers. In such an example, doped lead-zirconate-titanate and a non-conductive material such as a polymer like PEEK may be utilized. As an example, piezoelectric materials (e.g., in the form of discontinuous particles, particulates, short fibers of a desired aspect ratio, etc., may form a relatively continuous path between electrodes.

While the method 600 of FIG. 6 can include additive manufacture types of equipment, a method may involve one or more spray guns (e.g., paint type), one or more thermal scan units (e.g., one or more lasers), etc. As an example, a method may be iterative where multi-layer coatings can be applied.

As an example, a composite material can include polymer and PZT crystals where a laser can be utilized to form graphene directly on the composite material, for example, as one or more electrodes. As an example, a method can include depositing a first layer that includes polymer and converting at least a portion of the polymer to make an underneath electrode and then depositing another layer for a piezoelectric response and for forming another graphene electrode on that layer. In such an example, a dual layer deposition process may be utilized with two graphene generation operations. In such an example, a piezoelectric material can be in contact with graphene electrodes on two opposing sides of the piezoelectric material, which, as mentioned, may be a PZT crystal and polymeric composite material where a portion of the polymeric material may be convertible to graphene.

Figure 7:
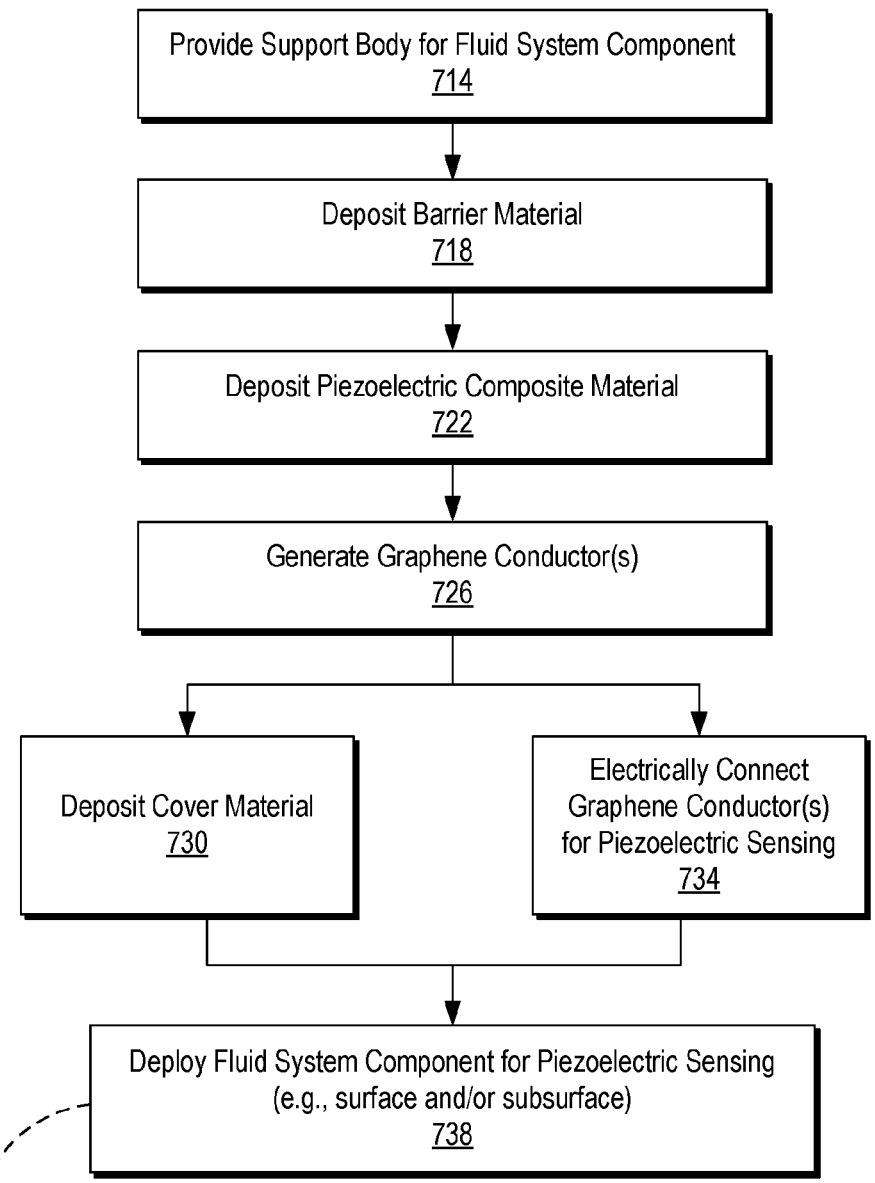
FIG. 7 illustrates examples of methods.
Figure 7:
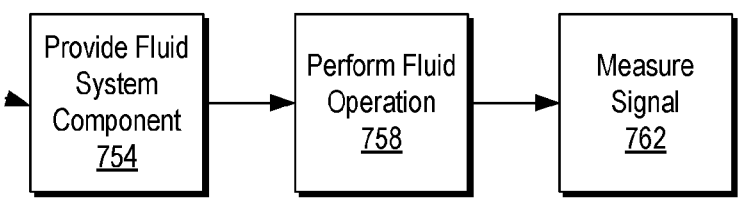

FIG. 7 shows an example of a method 710 and an example of a method 750. As shown, the method 710 can include a provision block 714 for providing a support body for a fluid system component, a deposition block 718 for depositing a barrier material (e.g., an insulator onto a metallic support body, etc., as appropriate), a deposition block 722 for depositing a piezoelectric composite material that can include a polymeric material that is convertible to graphene, a generation block 726 for converting at least a portion of the piezoelectric composite material to graphene (e.g., to form one or more electrical conductors, electrodes, etc.), a deposition block 730 for depositing a cover material over at least a portion of the graphene, an electrical connect block 734 for electrically connecting one or more graphene conductors for piezoelectric sensing, and a deployment block 738 for deploying the fluid system component for piezoelectric sensing.

In the example method 710, the deposition block 722 may deposit piezoelectric material and polymer (e.g., a polymeric material) where at least a portion of the polymer can be convertible to graphene. In such an example, a separate polymer deposition on top of the piezoelectric composite material may be foregone. Where, however, one or more graphene conductors are desired to be positioned below the piezoelectric composite material, a deposition block can be included for depositing a material such as polymer along with a generation block for generating one or more graphene conductors from at least a portion of the material. Thereafter, the deposition block 722 may be performed.

As an example, the method 710 can manufacture a fluid system component that includes a support body that includes a surface; and an electrical circuit supported at least in part by the surface, where the electrical circuit includes graphene adjacent to a composite material that includes a polymer convertible to graphene, and where the electrical circuit generates a signal responsive to deformation of at least a portion of the electrical circuit. In such an example, the composite material can include one or more ceramics. As an example, a composite material may be a piezoelectric composite material and/or a composite material may be deposited on a piezoelectric material where one or more polymers of the composite material may be converted to graphene (e.g., laser-induced graphene, etc.) to form at least a portion of one or more electrical circuits.

As an example, the barrier material may deposit a material that can be convertible to graphene. For example, as mentioned a polymer may be an electrical insulator and, as such, it may be utilized as the barrier material. In such an example, the barrier material may be deposited at a desired thickness where a portion of the thickness may be converted to graphene. In such an example, a portion of the barrier material may provide for electrical insulation where another portion of the barrier material may provide for electrical conduction as converted to graphene.

As an example, where a support body is electrically conductive and where a barrier material can be convertible to graphene, a generation process can generate graphene at a thickness of the barrier material such that the graphene is in electrical communication with the support body. In such an example, one or more points of contact, lines of contact, etc., may be formed. In such an example, one electrode may be the support body itself while another electrode is formed from conversion of material to graphene in a different layer, etc. As explained, circuitry may be electrically coupled to one or more electrodes for measuring and/or detecting a signal (e.g., including absence of a signal). In the foregoing example, a support body may form one electrode while another portion forms another electrode.

As to the example method 750 of FIG. 7, it may be a continuation of the method 710 or may be implemented separately, for example, after manufacture of the fluid system component. As shown, the method 750 can include a provision block 754 for providing a fluid system component that includes a support body that includes a surface and an electrical circuit supported at least in part by the surface, where the electrical circuit includes graphene adjacent to a composite material that includes a polymer convertible to graphene, and where the electrical circuit generates a signal responsive to deformation of at least a portion of the electrical circuit; a performance block 758 for performing a fluid operation involving the fluid system component; and a measurement block 762 for measuring the signal responsive to the fluid operation deforming at least a portion of the electrical circuit.

As explained, such a measurement may be via one or more types of circuitry, which may include uphole and/or downhole circuitry. For example, a downhole unit can include one or more types of circuitry that can make such a measurement and optionally store and/or act upon a value or values of a measured signal. As another example, surface equipment may include circuitry that can make such a measurement. As an example, circuitry can include analog-to-digital conversion circuitry where an analog signal can be converted into a digital signal, which may be in a form suitable for storage to a digital memory device, processing by a processor, etc.

As an example, a fluid operation can involve deployment. For example, the performance block 758 may provide for action akin to that of the deployment block 738 and/or the provision block 754 may involve deployment akin to the deployment block 738.

Figure 8:
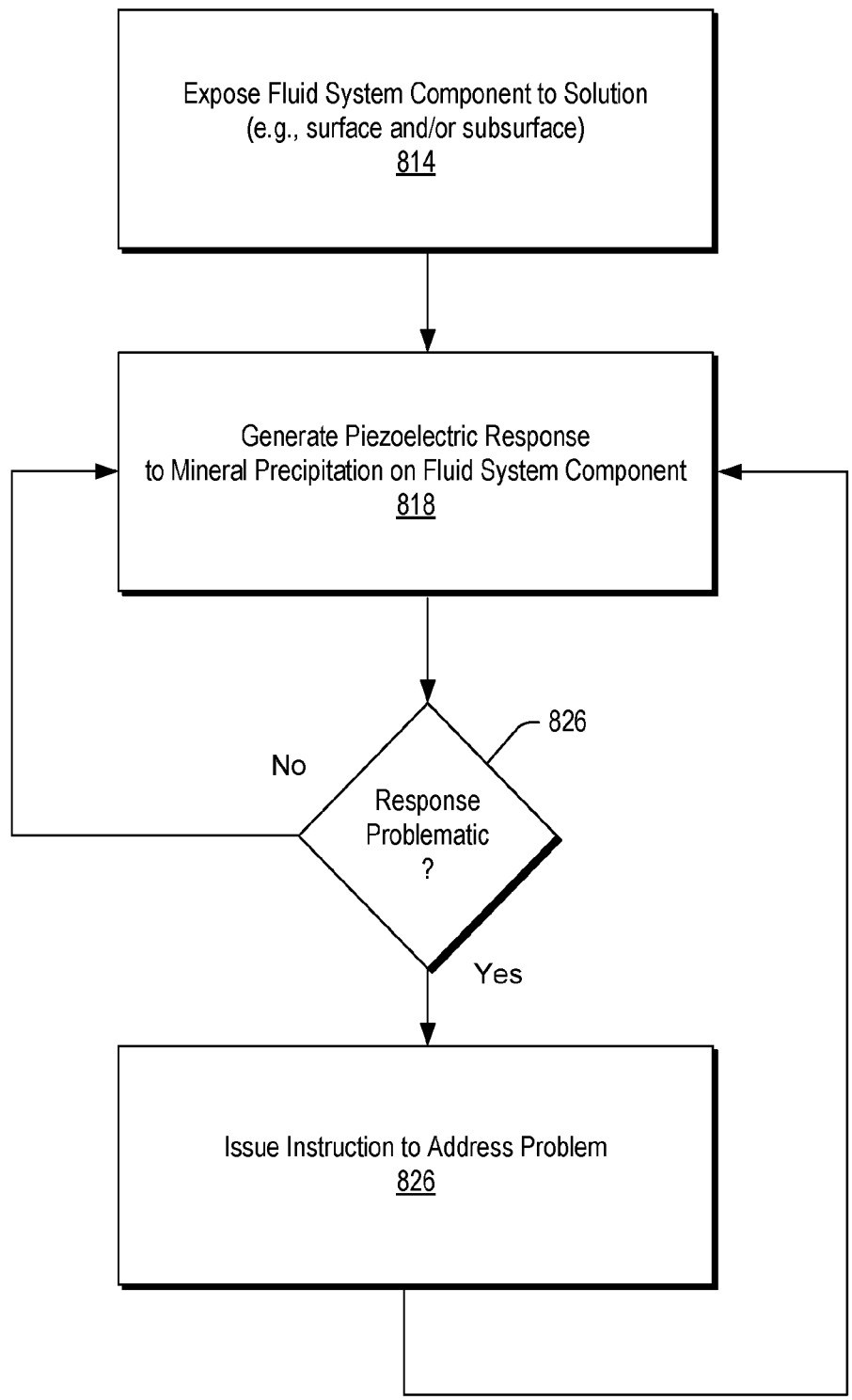
FIG. 8 illustrates an example of a method.

FIG. 8 shows an example of a method 810 that includes an exposure block 814 for exposing a fluid system component to a solution, a generation block 818 for generating a piezoelectric response to mineral precipitation on the fluid system component, a decision block 826 for deciding if the response is problematic, and an issuance block 826 for issuing an instruction to address the problem if the decision block 826 decides that the response is problematic (see, e.g., the "yes" decision branch). As shown, where the decision block 826 decides that the response is not problematic, the method 810 may continue to the generation block 818.

The method 810 may be utilized, for example, to monitor scale formation on the fluid system component using one or more piezoelectric and graphene regions. As to a problematic response, such a response may be indicative of scale formation and/or an extent of scale formation. As to addressing such a problem, as mentioned, an anti-scaling action may be taken, which may include one or more of chemical treatment and/or electrical treatment, the latter of which may include electromagnetic treatment.

Figure 9:
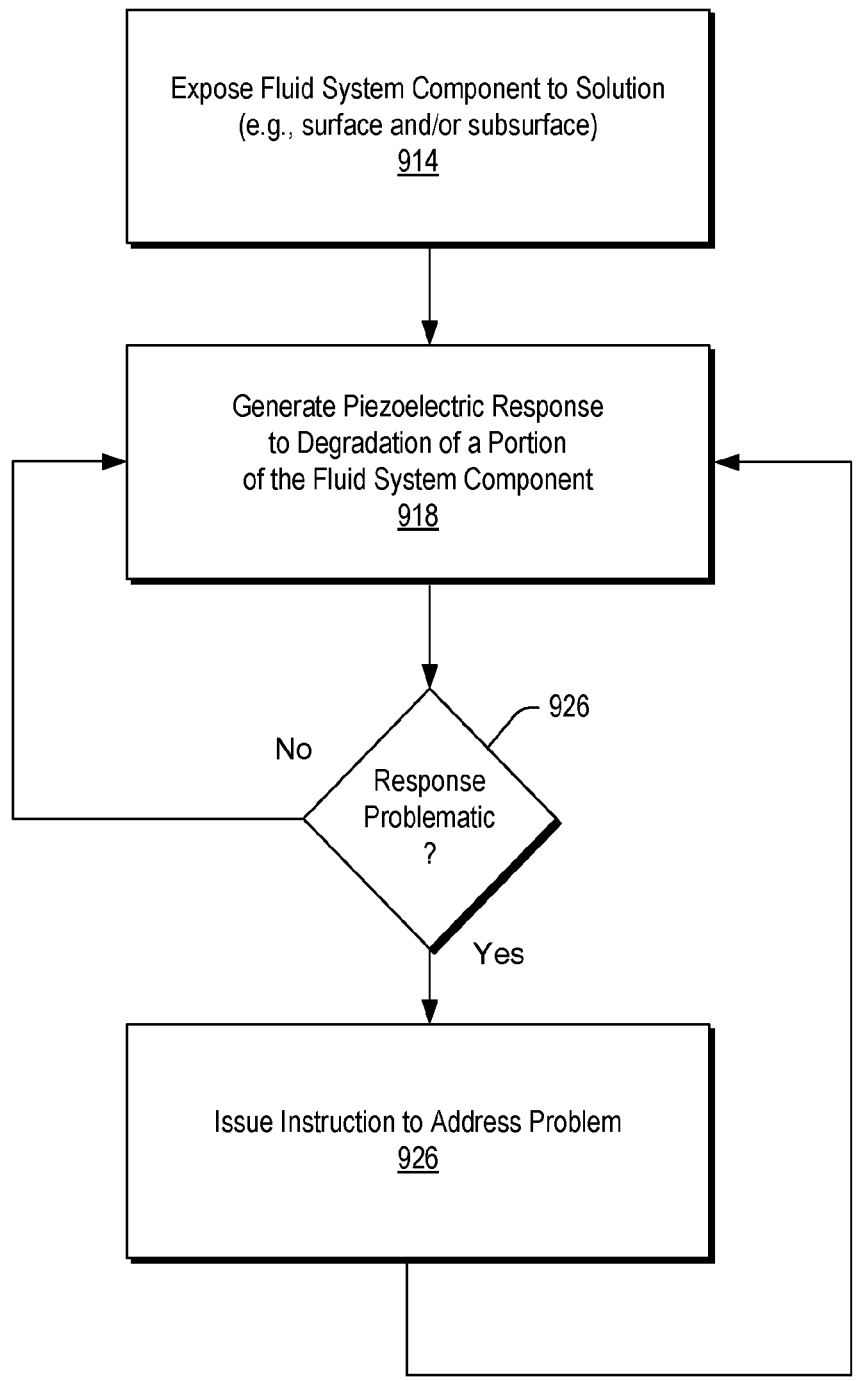
FIG. 9 illustrates an example of a method.

FIG. 9 shows an example of a method 910 that includes an exposure block 914 for exposing a fluid system component to a solution, a generation block 918 for generating a piezoelectric response to degradation of a portion of the fluid system component, a decision block 926 for deciding if the response is problematic, and an issuance block 926 for issuing an instruction to address the problem if the decision block 926 decides that the response is problematic (see, e.g., the "yes" decision branch). As shown, where the decision block 926 decides that the response is not problematic, the method 910 may continue to the generation block 918.

The method 910 may be utilized, for example, to monitor degradation of at least a portion of the fluid system component using one or more piezoelectric and graphene regions. As to a problematic response, such a response may be indicative of a lack of degradation (e.g., too slow of a rate of degradation, etc.) and/or too fast of a rate of degradation. As to addressing such a problem, one or more actions may be taken, which may include one or more of chemical treatment and/or electrical treatment that may aim to adjust or otherwise control degradation.

Figure 10:
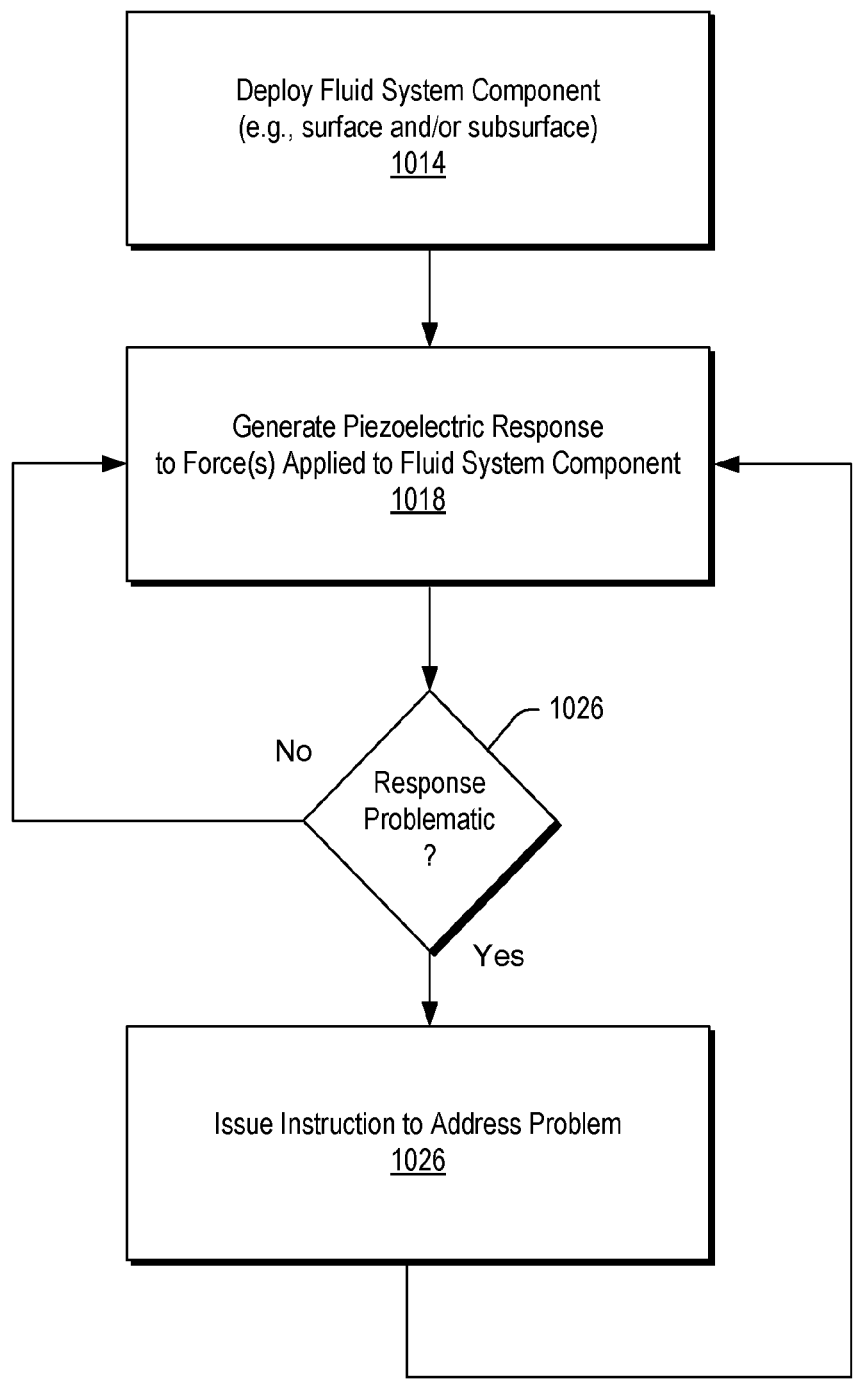
FIG. 10 illustrates an example of a method.

FIG. 10 shows an example of a method 1010 that includes a deployment block 1014 for deploying a fluid system component (e.g., in a surface and/or a subsurface environment), a generation block 1018 for generating a piezoelectric response to one or more forces applied to the fluid system component, a decision block 1026 for deciding if the response is problematic, and an issuance block 1026 for issuing an instruction to address the problem if the decision block 1026 decides that the response is problematic (see, e.g., the "yes" decision branch). As shown, where the decision block 1026 decides that the response is not problematic, the method 1010 may continue to the generation block 1018.

The method 1010 may be utilized, for example, to monitor force applied to at least a portion of the fluid system component using one or more piezoelectric and graphene regions. As to a problematic response, such a response may be indicative of too much force and/or too little force. As to addressing such a problem, one or more actions may be taken, which may include one or more of adjusting a flow rate, adjusting a chemical treatment and/or adjusting an electrical treatment that may aim to adjust or otherwise control force experienced by the fluid system component.

As an example, one or more of the method 810, 910 and 1010 may be performed for a particular fluid system component. For example, consider a ball and seat where the seat is set within a conduit and where the ball is to be deployed to sit in the seat to block flow in the conduit. In such an example, scale may be an issue as scale on the seat may cause the ball to sit inappropriately such that leakage occurs resulting in a lack of desired fluid isolation. In such an example, force experienced by the seat may be different than if the ball and the seat formed a seal as leakage may result in a decrease in force. In such an example, where the ball and/or the seat are degradable, one or more "smart" portions of the seat and/or the ball may generate a signal and/or cease to generate a signal responsive to degradation where, when measured with respect to time, a rate or rates of degradation may be determined. In response, a fluid system operation may be adjusted or otherwise controlled such that the fluid system operation proceeds according to a plan and/or for a particular desired purpose.

As an example, a fluid system component can be a "smart" component for making pressure measurements, for example, including sealing pressure (e.g., behind elastomers, etc.), displacement measurement (e.g., location sensor, etc.), strain measurement, etc.

As an example, a piezoelectric and graphene region can be part of a relatively long cylindrical assembly, tubular structure, a window, a plug, etc.

As an example, a piezoelectric and graphene region can be part of a fastener (e.g., nuts, bolts, threads, etc.), which may provide an ability to measure assembly torque.

Figure 11:
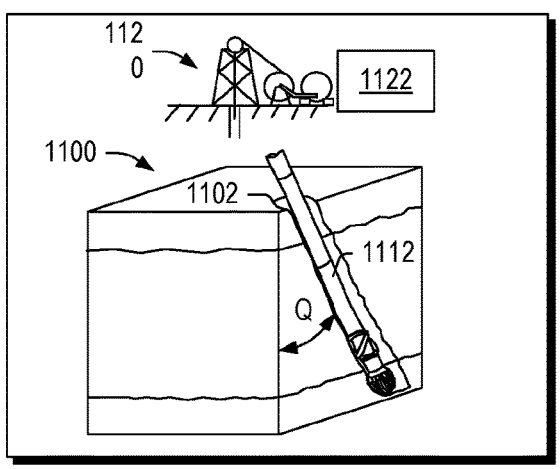
FIG. 11 illustrates examples of equipment.
Figure 11:
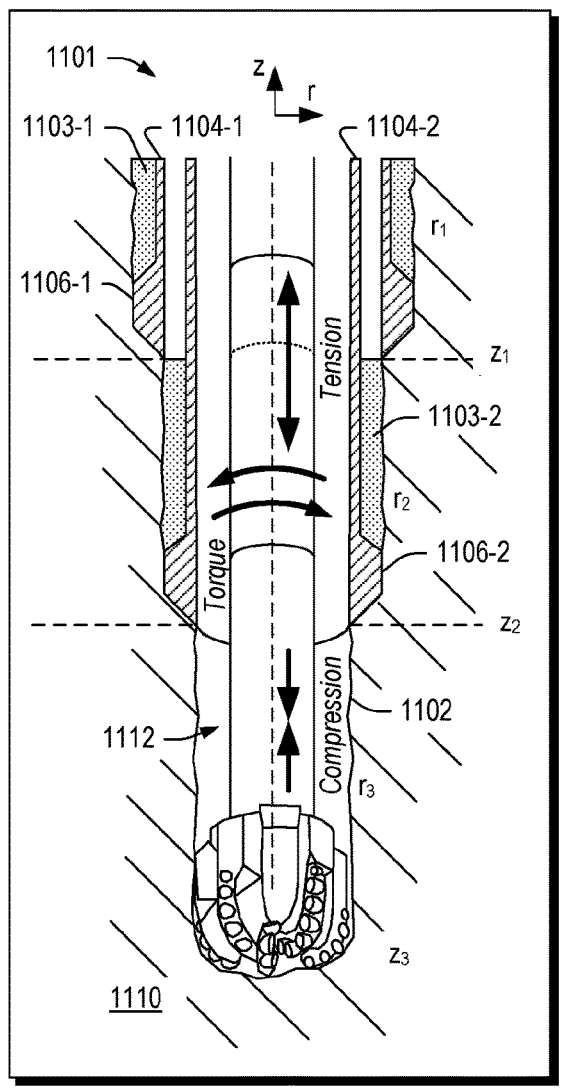
Figure 11:
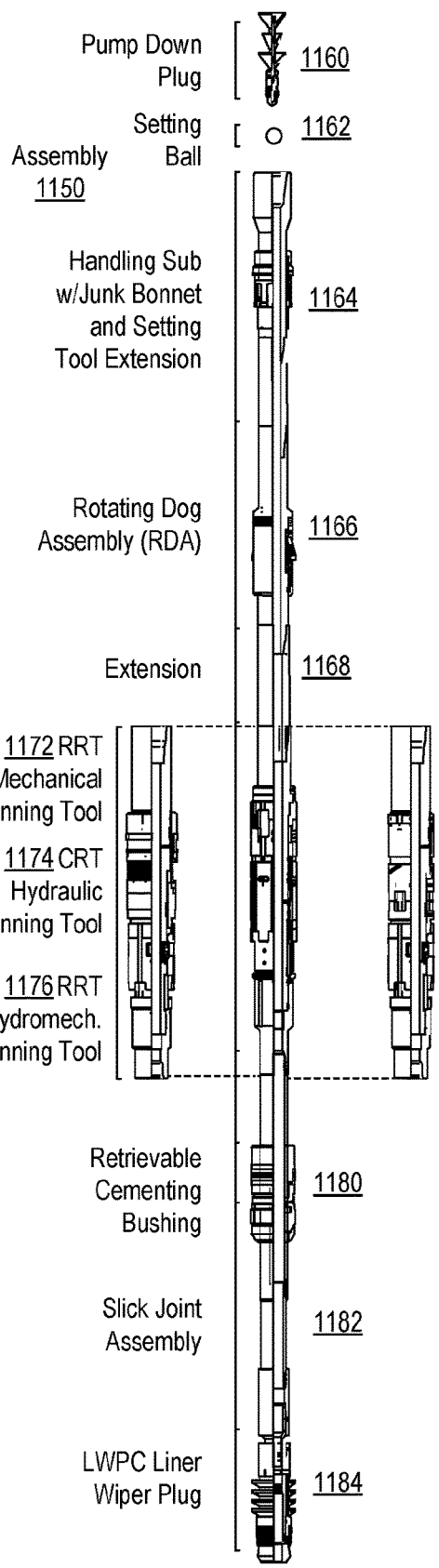
Figure 12:
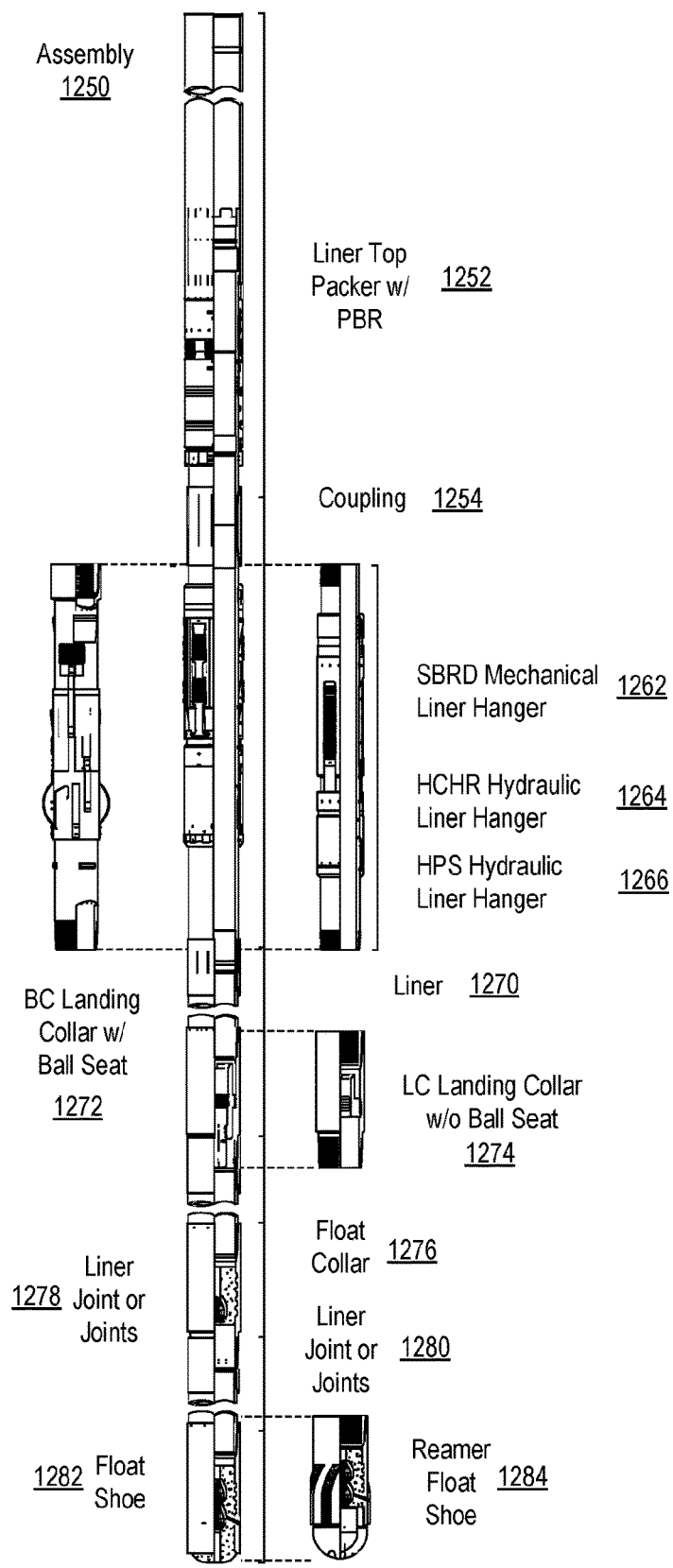
FIG. 12 illustrates examples of equipment.

FIGS. 11 and 12 show an example of an environment 1100, an example of a portion of a completion 1101, an example of equipment 1120 and examples of assemblies 1150 and 1250, which may be utilized in one or more completions operations. As an example, the equipment 1120 may include a rig, a turntable, a pump, drilling equipment, pumping equipment, equipment for deploying an assembly, a part of an assembly, etc. As an example, the equipment 1120 may include one or more controllers 1122. As an example, a controller may include one or more processors, memory and instructions stored in memory that are executable by a processor, for example, to control one or more pieces of equipment (e.g., motors, pumps, sensors, etc.). As an example, the equipment 1120 may be deployed at least in part at a well site and, optionally, in part at a remote site.

In FIG. 11, the environment 1100 includes a subterranean formation into which a bore 1102 extends where a tool 1112 such as, for example, a drill string is disposed in the bore 1102. As an example, the bore 1102 may be defined in part by an angle (θ); noting that while the bore 1102 is shown as being deviated, it may be vertical (e.g., or include one or more vertical sections along with one or more deviated sections). As shown in an enlarged view with respect to an r, z coordinate system (e.g., a cylindrical coordinate system), a portion of the bore 1102 includes casings 1104-1 and 1104-2 having casing shoes 1106-1 and 1106-2. As shown, cement annuli 1103-1 and 1103-2 are disposed between the bore 1102 and the casings 1104-1 and 1104-2. Cement such as the cement annuli 1103-1 and 1103-2 can support and protect casings such as the casings 1104-1 and 1104-2 and when cement is disposed throughout various portions of a wellbore such as the wellbore 1102, cement may help achieve zonal isolation.

In the example of FIG. 11, the bore 1102 has been drilled in sections or segments beginning with a large diameter section (see, e.g., $r_1$) followed by an intermediate diameter section (see, e.g., $r_2$) and a smaller diameter section (see, e.g., $r_3$). As an example, a large diameter section may be a surface casing section, which may be three or more feet in diameter and extend down several hundred feet to several thousand feet. A surface casing section may aim to prevent washout of loose unconsolidated formations. As to an intermediate casing section, it may aim to isolate and protect high pressure zones, guard against lost circulation zones, etc. As an example, intermediate casing may be set at about 6000 feet (e.g., about 2000 m) and extend lower with one or more intermediate casing portions of decreasing diameter (e.g., in a range from about thirteen to about five inches in diameter). A so-called production casing section may extend below an intermediate casing section and, upon completion, be the longest running section within a wellbore (e.g., a production casing section may be thousands of feet in length). As an example, production casing may be located in a target zone where the casing is perforated for flow of fluid into a bore of the casing.

A liner may be a casing (e.g., a completion component) that may be installed via a liner hanger system. As an example, a liner hanger system may include various features such as, for example, one or more of the features of the assembly 1150 and/or the assembly 1250 of FIGS. 11 and 12.

As shown in FIG. 11, the assembly 1150 can include a pump down plug 1160, a setting ball 1162, a handling sub with a junk bonnet and setting tool extension 1164, a rotating dog assembly (RDA) 1166, an extension(s) 1168, a mechanical running tool 1172, a hydraulic running tool 1174, a hydromechanical running tool 1176, a retrievable cementing bushing 1180, a slick joint assembly 1182 and/or a liner wiper plug 1184.

As shown in FIG. 12, the assembly 1250 can include a liner top packer with a polished bore receptacle (PBR) 1252, a coupling(s) 1254, a mechanical liner hanger 1262, a hydraulic liner hanger 1264, a hydraulic liner hanger 1266, a liner(s) 1270, a landing collar with a ball seat 1272, a landing collar without a ball seat 1274, a float collar 1276, a liner joint or joints 1278 and/or 1280, a float shoe 1282 and/or a reamer float shoe 1284.

One or more pieces of equipment of FIG. 11 or FIG. 12 can include graphene as formed, to be part of a circuit that can generate a signal, which may be an inherent signal or a signal that is altered (e.g., responsive to force, degradation, etc.). As shown in FIG. 11, the tool 1112 may experience one or more of tension, torque (e.g., torsion) and compression. Where the tool 1112 includes one or more piezoelectric and graphene regions, the tool 1112 may be a smart tool that can generate a signal or signals responsive to one or more of tension, torsion and compression.

As an example, a method can include setting a liner hanger, releasing a running tool, cementing a liner and setting a liner top packer. As an example, a method can include pumping heavy fluid (e.g., cement) down an annulus from a point above a liner hanger and a liner top packer. In such an example, stress on a formation may be reduced when compared to a method that pumps heavy fluid (e.g., cement) up such an annulus. For example, stress may be reduced as back pressure developed during pumping may be contained in between a casing and a landing string.

As an example, a production well may experience a decline in production (e.g., production rate as a fluid flow rate). In such an example, one or more techniques, technologies, etc., may be utilized to assist and/or enhance production (e.g., consider one or more enhanced oil recovery (EOR) approaches, etc.). As an example, artificial lift technology may be utilized to assist production of fluid(s) from a well that is in fluid communication with a reservoir. Artificial lift technology can add energy to fluid to enhance production of the fluid. Artificial lift systems can include rod pumping systems, gas lift systems and electric submersible pump (ESP) systems. As an example, an artificial lift pumping system can utilize a surface power source to drive a downhole pump assembly. As an example, a beam and crank assembly may be utilized to create reciprocating motion in a sucker-rod string that connects to a downhole pump assembly. In such an example, the pump can include a plunger and valve assembly that converts the reciprocating motion to fluid movement (e.g., lifting the fluid against gravity, etc.). As an example, an artificial lift gas lift system can provide for injection of gas into production tubing to reduce the hydrostatic pressure of a fluid column. In such an example, a resulting reduction in pressure can allow reservoir fluid to enter a wellbore at a higher flow rate. A gas lift system can provide for conveying injection gas down a tubing-casing annulus where it can enter a production train through one or more gas-lift valves (e.g., a series of gas-lift valves, etc.). As an example, an electric submersible pump (ESP) can include a stack of impeller and diffuser stages where the impellers are operatively coupled to a shaft driven by an electric motor. As an example, an electric submersible pump (ESP) can include a piston that is operatively coupled to a shaft driven by an electric motor, for example, where at least a portion of the shaft may include one or more magnets and form part of the electric motor.

Examples of artificial lift equipment can include a gas lift (GL) system, a rod pumping (RP) system, and an ESP system. Such equipment may be disposed at least in part in a downhole environment to facilitate production of fluid; noting that a pump system (e.g., RP and/or ESP) may be utilized to move fluid to a location other than a surface location (e.g., consider injection to inject fluid into a subterranean region, etc.). A gas lift system operates at least in part on buoyancy as injected gas may be expected to rise due to buoyancy in a direction that is opposite gravity; whereas, a RP or an ESP may operate via mechanical movement of physical components to drive fluid in a desired direction, which may be with or against gravity.

Figure 13:
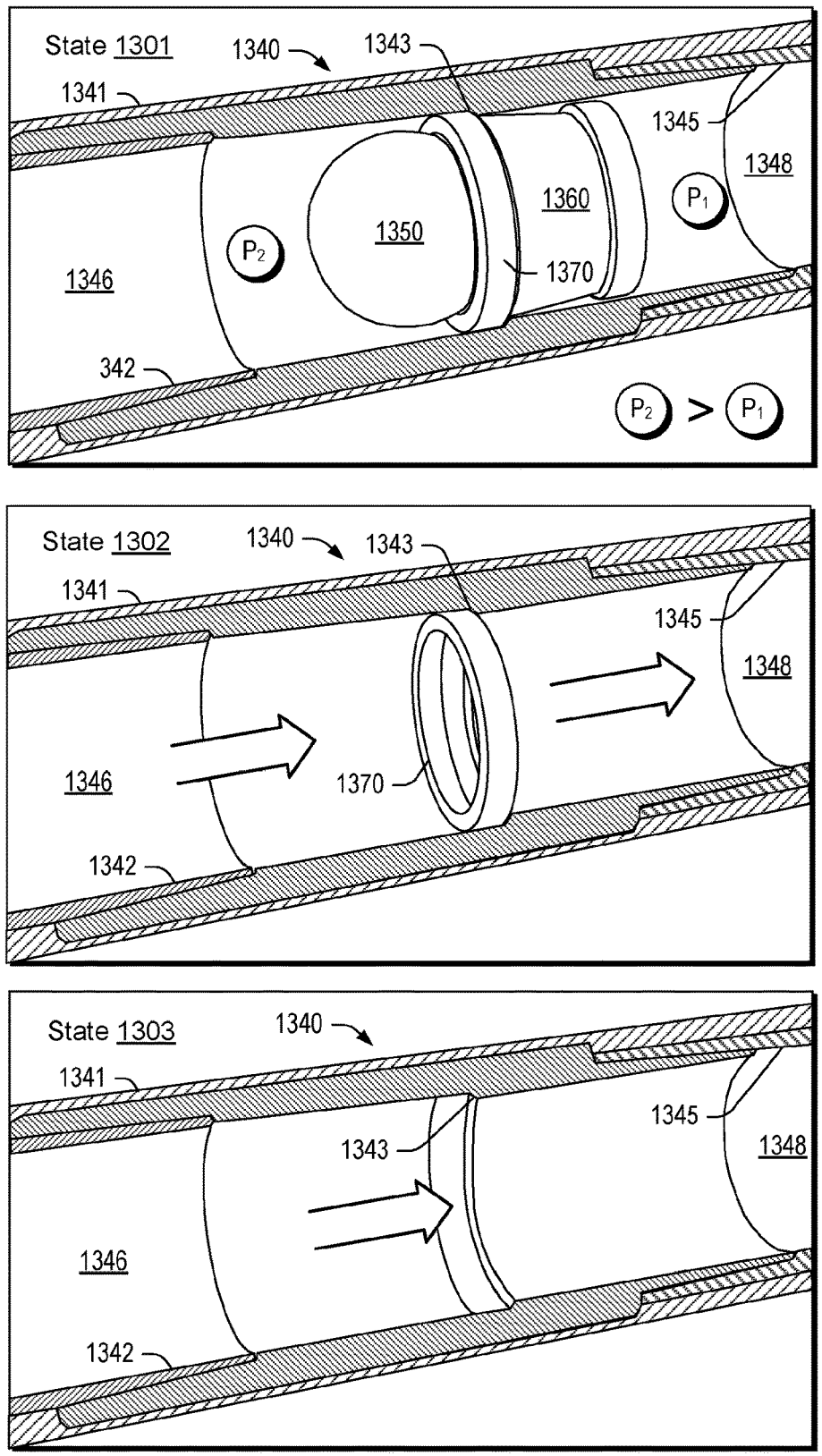
FIG. 13 illustrates examples of equipment.

FIG. 13 shows an example of equipment in various states 1301, 1302 and 1303. As shown, the equipment can include a casing 1340 that include various components 1341, 1342, 1343 and 1345. For example, the component 1342 may define a bore 1346 and the component 1345 may define a bore 1348 where the component 1343 includes features (e.g., reduced diameter, conical shape, receptacle, etc.) that can catch a ring component 1370 that is operatively coupled to a plug component 1360 where the ring component 1370 and the plug component 1360 may position and seat a plug 1350 in the casing 1340. As an example, a seal may be formed by the plug 1350 with respect to the plug component 1360 and/or the ring component 1370 and, for example, a seal may be formed by the ring component 1370 with respect to the component 1343. In such an approach, the seals may be formed in part via fluid pressure in a manner where increased pressure acts to increase seal integrity (e.g., reduce clearances that may be subject to leakage). As an example, the ring component 1370 may be an upper component (e.g., a proximal component) of a plug seat and the plug component 1360 may be a lower component (e.g., a distal component) of the plug seat.

As shown in the state 1301, the plug 1350 may be seated such that the bore 1346 (e.g., of a first zone) is separated (e.g., isolated) from the bore 1348 (e.g., of a second zone) such that fluid pressure in the bore 1346 (see, e.g., $P_2$) may be increased to a level beyond fluid pressure in the bore 1348 (see, e.g., $P_1$). Where the plug 1350 and the plug component 1360 are degradable, for example, upon contact with fluid that may pressurize the bore 1348, degradation of the plug 1350 and the plug component 1360 may transition the equipment from the state 1301 to the state 1302. As shown in the state 1302, fluid may pass from the bore 1346 to the bore 1348, for example, via an opening of the ring component 1370. Where the ring component 1370 is degradable, for example, upon contact with fluid in the bore 1346, degradation of the ring component 1370 may transition the equipment from the state 1302 to the state 1303. In the state 1303, the casing 1340 may be the remaining equipment of the state 1301 (e.g., the plug 1350, the plug component 1360 and the ring component 1370 are at least in part degraded).

As an example, the plug 1350, the plug component 1360 and the ring component 1370 may be components of a dissolvable plug and perforation system that may be used to isolate zones during stimulation. Such equipment may be implemented in, for example, cemented, uncemented, vertical, deviated, or horizontal bores (e.g., in shale, sandstone, dolomite, etc.).

As an example, the plug component 1360 and the ring component 1370 may be conveyed in a bore via a pump down operation (e.g., which may move the components 1360 and 1370 along a bore axis direction). As an example, a component or components may include adjustable features, for example, that allow a change in diameter to facilitate seating in a receptacle disposed in a bore. For example, a tool may interact with a component or components to cause a change in diameter or diameters (e.g., a change in form of one or more components). In the changed state, the component or components may catch and seat in a receptacle disposed in a bore (e.g., seat in a shoulder of a receptacle component).

As an example, the plug component 1360 and the ring component 1370 may be seated in a receptacle by a tool that may include one or more perforators. Once seated, the tool may be repositioned to perforate casing and form channels (e.g., in a layer or layers of rock). As an example, repositioning may occur multiple times, for example, to form multiple sets of perforations and multiple sets of channels. As an example, after perforating and channel formation, the plug 1350 may be pumped down to contact the plug component 1360 and/or the ring component 1370, for example, to form a seal that can isolate one zone from another zone (e.g., one interval from another interval). Fluid pressure may be increased in an isolated zone as defined by the plug 1350, the plug component 1360 and the ring component 1370 as positioned in a receptacle disposed in a bore such that the fluid enters channels via perforations of the isolated zone and generates fractures (e.g., new fractures, reactivated fractures, etc.).

As an example, a method can include blending of water reactive or degradable powder with one or more other powders where the water reactive or degradable powder is in a range of about 5 percent to about 95 percent of the weight of a blend. In such an example, a powder may be age-hardenable non-degradable powders (e.g., consider aluminum 6000 and 7000 series); may be strain hardenable non-degradable powders (e.g., consider aluminum 5000 series, etc.); may be a powder that includes highly thermally stable nanocrystalline grains processed by cryomilling; may be a powder that includes highly thermally stable nanocrystalline grains processed by cryomilling that are further stabilized by dispersoids (e.g., SiC, $B_4C$, $Al_2O_3$, etc.), for example, to produce a metal matrix composite (MMC); etc. As an example, a method can include blending water reactive or degradable powder with material that includes highly thermally stable nanocrystalline grains processed by cryomilling and optionally further blending dispersoids (e.g., SiC, $B_4C$, $Al_2O_3$, etc.) to form a MMC.

As an example, a metal matrix composite (MMC) may be utilized as a support body as part of a component that may be a degradable component (e.g., a degradable downhole component, etc.).

Figure 14:
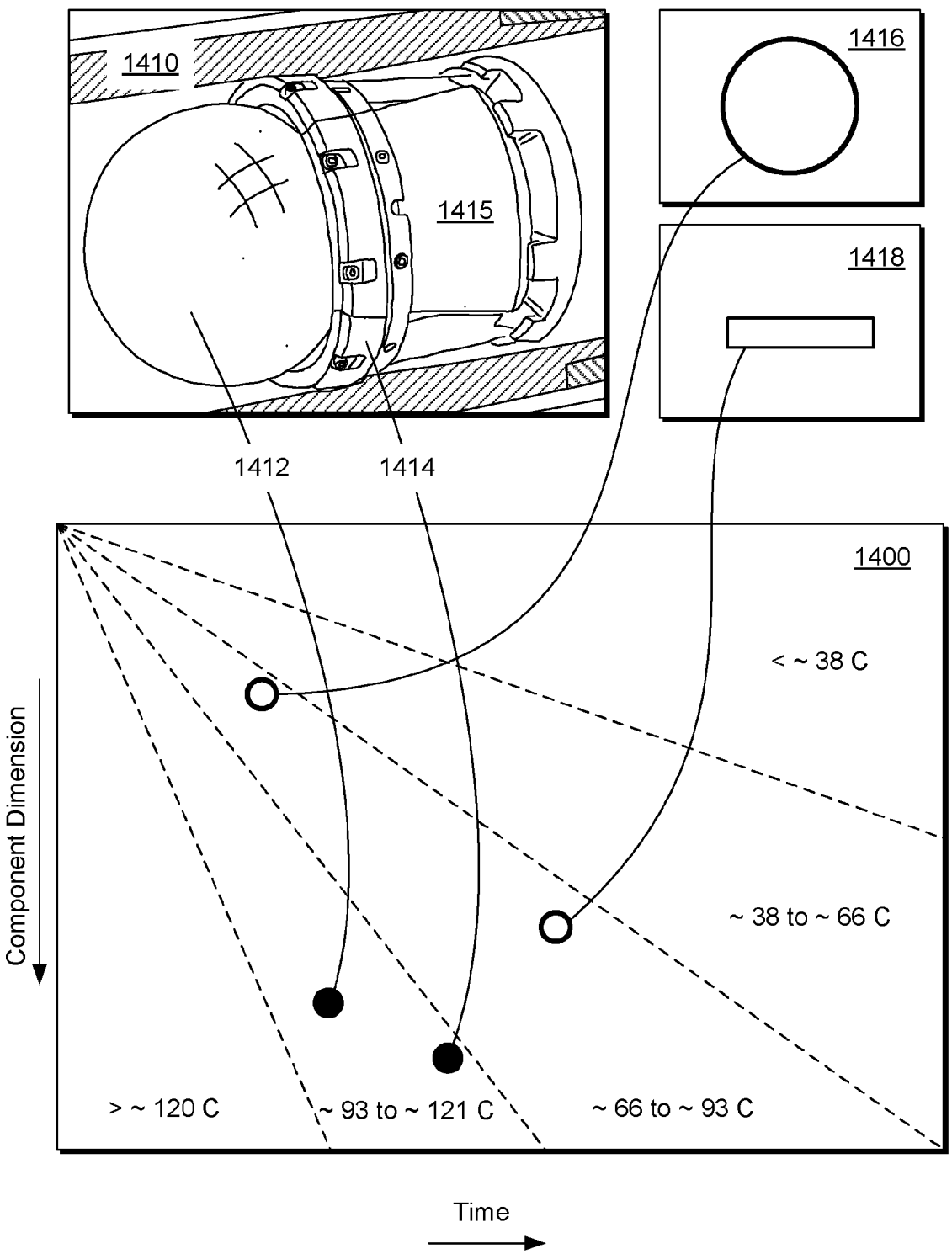
FIG. 14 illustrates examples of equipment and an example of a plot.

FIG. 14 shows an example plot 1400 of component dimension versus time of degradation for various temperatures and an example of an assembly 1410 that includes components 1412, 1414 and 1415 that may be made by consolidating particulate materials, an example, degradable polymeric materials 1416 and 1418, which may optionally be included in an assembly such as, for example, the assembly 1410.

As indicated, degradation of a component may be determined by a physical characteristic of the component and an environmental condition such as, for example, temperature. For example, fluid at a temperature of about 120 degrees C. may cause a component to degrade more rapidly than fluid at a temperature of about 66 degrees C. As an example, a component may be constructed to include one or more layers where at least one layer includes a degradable material, which may include a dimension (e.g., thickness, etc.) that is based at least in part on information such as the information of the plot 1400 of FIG. 14. As an example, a layer may be a degradable polymeric material layer. As an example, a layer may be or include a degradable piezoelectric and graphene region. In such an example, degradation of a matrix material may result in release of material such as PZT and graphene where such material is relatively small in size and can flow in a fluid stream with minimal risk of plugging an opening (e.g., a port, a perforation, etc.).

As an example, the assembly 1410 may include one component that degrades at a rate that differs from another component. For example, the plug component 1412 (e.g., a ball, etc.) may degrade more rapidly than the plug seat component 1414 (e.g., a ring that can include a plug seat and that may act to locate the plug seat). As shown in FIG. 14, the assembly 1410 can include a plurality of pieces where such pieces may be formed according to desired dissolution rate, strength and/or ductility.

One or more pieces of equipment of FIG. 13 or FIG. 14 can include graphene, as formed, to be part of a circuit that can generate a signal, which may be an inherent signal or a signal that is altered (e.g., responsive to force, degradation, etc.).

Figure 15:
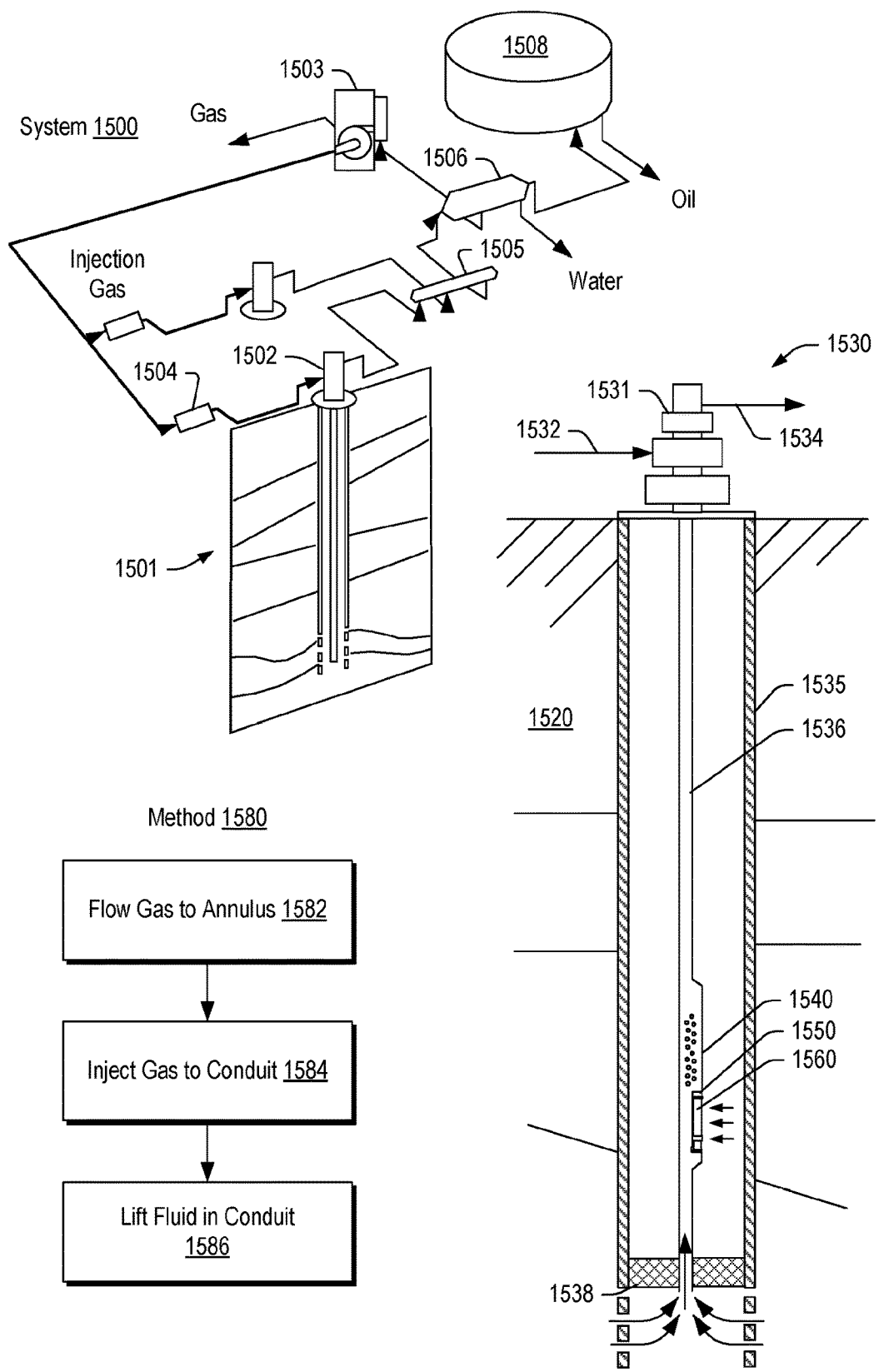
FIG. 15 illustrates an example of a system and an example of a method.

FIG. 15 shows an example of a system 1500 that includes various types of equipment where at least some of the equipment may scale and/or affect a scaling mechanism. For example, gas lift equipment can experience scale formation and, for example, may alter one or more of pressure, temperature, chemistry, phase dynamics, etc. In the example of FIG. 15, various fluid system components are at surface and various fluid system components are subsurface; noting that various fluid system component can extend from a position that is subsurface to a position that is at surface.

In FIG. 15, the system 1500 is shown with an example of a geologic environment 1520 that includes equipment and an example of a method 1580. The system 1500 includes a subterranean formation 1501 with a well 1502. Injection gas is provided to the well 1502 via a compressor 1503 (e.g., a fluid pump, etc.) and a regulator 1504 (e.g., a fluid controller). The injection gas can assist with lifting fluid that flows from the subterranean formation 1501 to the well 1502. The lifted fluid, including injected gas, may flow to a manifold 1505 (e.g., a fluid system component with multiple fluid inlets and/or fluid outlets), for example, where fluid from a number of wells may be combined. As shown in the example of FIG. 15, the manifold 1505 is operatively coupled to a separator 1506, which may separate components of the fluid. For example, the separator 1506 may separate oil, water and gas components as substantially separate phases of a multiphase fluid. In such an example, oil may be directed to an oil storage facility 1508 via tubing while gas may be directed to the compressor 1503 via tubing, for example, for re-injection, storage and/or transport to another location. As an example, water may be directed to a water discharge, a water storage facility, etc.

As shown in FIG. 15, the geologic environment 1520 is fitted with well equipment 1530, which includes a well-head 1531 (e.g., a Christmas tree, etc.), an inlet conduit 1532 for flow of compressed gas, an outlet conduit 1534 for flow of produced fluid, a casing 1535, a production conduit 1536, and a packer 1538 that forms a seal between the casing 1535 and the production conduit 1536. As shown, fluid may enter the casing 1535 (e.g., via perforations) and then enter a lumen of the production conduit 1536, for example, due to a pressure differential between the fluid in the subterranean geologic environment 1520 and the lumen of the production conduit 1536 at an opening of the production conduit 1536. Where the inlet conduit 1532 for flow of compressed gas is used to flow gas to the annular space between the casing 1535 and the production conduit 1536, a mandrel 1540 operatively coupled to the production conduit 1536 that includes a pocket 1550 that seats a gas lift valve 1560 that may regulate the introduction of the compressed gas into the lumen of the production conduit 1536. In such an example, the compressed gas introduced may facilitate flow of fluid upwardly to the well-head 1531 (e.g., opposite a direction of gravity) where the fluid may be directed away from the well-head 1531 via the outlet conduit 1534.

As shown in FIG. 15, the method 1580 can include a flow block 1582 for flowing gas to an annulus (e.g., or, more generally, a space exterior to a production conduit fitted with a gas lift valve), an injection block 1584 for injecting gas from the annulus into a production conduit via a gas lift valve or gas lift valves and a lift block 286 for lifting fluid in the production conduit due in part to buoyancy imparted by the injected gas.

As shown in the example of FIG. 15, various types of fluid system components can be in contact with one or more types of fluids. As an example, one or more of such fluid system components can include one or more piezoelectric and graphene regions.

As an example, where a gas lift valve includes one or more actuators, such actuators may optionally be utilized to control, at least in part, operation of a gas lift valve (e.g., one or more valve members of a gas lift valve). As an example, surface equipment can include one or more control lines that may be operatively coupled to a gas lift valve or gas lift valves, for example, where a gas lift valve may respond to a control signal or signals via the one or more control lines. As an example, surface equipment can include one or more power lines that may be operatively coupled to a gas lift valve or gas lift valves, for example, where a gas lift valve may respond to power delivered via the one or more power lines. As an example, a system can include one or more control lines and one or more power lines where, for example, a line may be a control line, a power line or a control and power line.

As an example, a production process may optionally utilize one or more fluid pumps such as, for example, an electric submersible pump (e.g., consider a centrifugal pump, a rod pump, etc.). As an example, a production process may implement one or more so-called "artificial lift" technologies. An artificial lift technology may operate by adding energy to fluid, for example, to initiate, enhance, etc. production of fluid.

Figure 16:
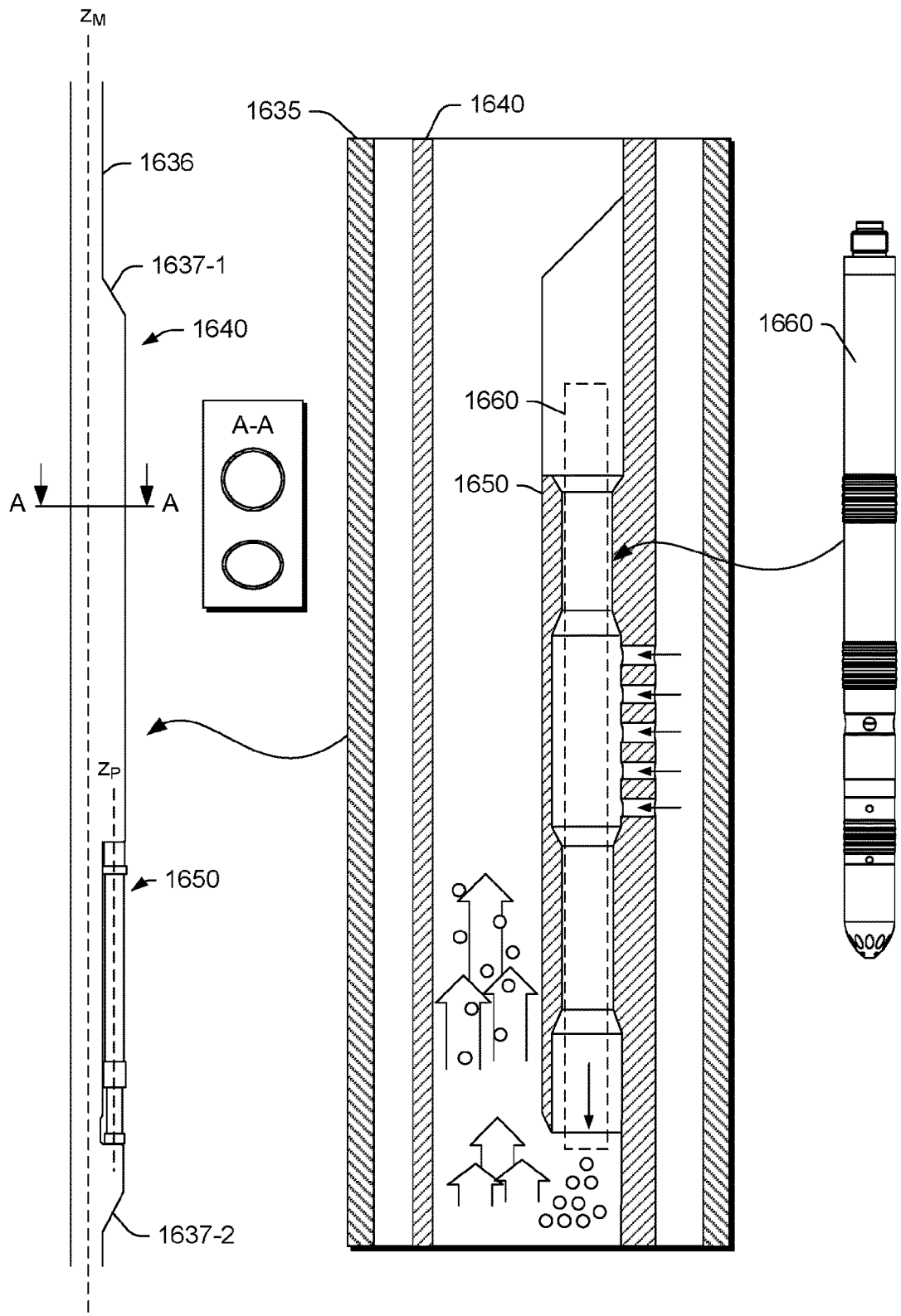
FIG. 16 illustrates an example of a system.

FIG. 16 shows an example of a system 1600 that includes a casing 1635, a production conduit 1636 and a mandrel 1640 that includes a pocket 1650 that seats a gas lift valve 1660. As shown, the mandrel 1640 can include a main longitudinal axis ($z_M$) and a side pocket longitudinal axis ($z_P$) that is offset a radial distance from the main longitudinal axis ($z_M$). In the example of FIG. 16, the axes ($z_M$ and $z_P$) are shown as being substantially parallel such that a bore of the pocket 1650 is parallel to a lumen of the mandrel 1640. Also shown in FIG. 16 are two examples of cross-sectional profiles for the mandrel 1640, for example, along a line A-A. As shown, a mandrel may include a circular cross-sectional profile or another shaped profile such as, for example, an oval profile.

As an example, a completion may include multiple instances of the mandrel 1640, for example, where each pocket of each instance may include a gas lift valve where, for example, one or more of the gas lift valves may differ in one or more characteristics from one or more other of the gas lift valves (e.g., pressure settings, etc.).

As shown in the example of FIG. 16, the mandrel 1640 can include one or more openings that provide for fluid communication with fluid in an annulus (e.g., gas and/or other fluid), defined by an outer surface of the mandrel 1640 and an inner surface of the casing 1635, via a gas lift valve 1660 disposed in the pocket 1650. For example, the gas lift valve 1660 may be disposed in the pocket 1650 where a portion of the gas lift valve 1660 is in fluid communication with an annulus (e.g., with casing fluid) and where a portion of the gas lift valve 1660 is in fluid communication with a lumen (e.g., with tubing fluid). In such an example, fluid may flow from the annulus to the lumen (e.g., bore) to assist with lift of fluid in the lumen or, for example, fluid may flow from the lumen to the annulus. The pocket 1650 may include an opening that may be oriented downhole and one or more openings that may be oriented in a pocket wall, for example, directed radially to a lumen space. As an example, the pocket 1650 may include a production conduit lumen side opening (e.g., an axial opening) for placement, retrieval, replacement, adjustment, etc. of a gas lift valve. For example, through use of a tool, the gas lift valve 1660 may be accessed. As an example, where a gas lift valve includes circuitry such as a battery or batteries, a tool may optionally provide for charging and/or replacement of a battery or batteries.

In the example of FIG. 16, gas is illustrated as entering from the annulus to the gas lift valve 1660 as disposed in the pocket 1650. Such gas can exit at a downhole end of the gas lift valve 1660 where the gas can assist in lifting fluid in the lumen of the mandrel 1640 (e.g., as supplied via a bore of production tubing, etc.).

As an example, a side pocket mandrel may be configured with particular dimensions, for example, according to one or more dimensions of commercially available equipment. As an example, a side pocket mandrel may be defined in part by a tubing dimension (e.g., tubing size). For example, consider tubing sizes of about 2.375 in (e.g., about 60 mm), of about 2.875 in (e.g., about 73 mm) and of about 3.5 in (e.g., about 89 mm). As to types of valves that may be suitable for installation in a side pocket mandrel, consider dummy valves, shear orifice valves, circulating valves, chemical injection valves and waterflood flow regulator valves. As an example, a side pocket may include a bore configured for receipt of a device that includes an outer diameter of about 1 in (e.g., about 25 mm), or about 1.5 in. (e.g., about 37 mm) or more. As mentioned, a running tool, a pulling tool, a kickover tool, etc. may be used for purposes of installation, retrieval, adjustment, etc. of a device with respect to a side pocket. As an example, a tool may be positionable via a slickline technique.

As an example, a side pocket mandrel may include a circular and/or an oval cross-sectional profile (e.g., or other shaped profile). As an example, a side pocket mandrel may include an exhaust port (e.g., at a downhole end of a side pocket).

As an example, a mandrel may be fit with a gas lift valve that may be, for example, a valve according to one or more specifications such as an injection pressure-operated (IPO) valve specification. As an example, a positive-sealing check valve may be used such as a valve qualified to meet API-19G1 and G2 industry standards and pressure barrier qualifications. For example, with a test pressure rating of about 10,000 psi (e.g., about 69,000 kPa), a valve may form a metal-to-metal barrier between production tubing and a casing annulus that may help to avoid undesired communication (e.g., or reverse flow) and to help mitigate risks associated with gas lift valve check systems.

One or more pieces of equipment of FIG. 15 or FIG. 16 can include graphene as formed to be part of a circuit that can generate a signal, which may be an inherent signal or a signal that is altered (e.g., responsive to force, degradation, etc.).

Figure 17:
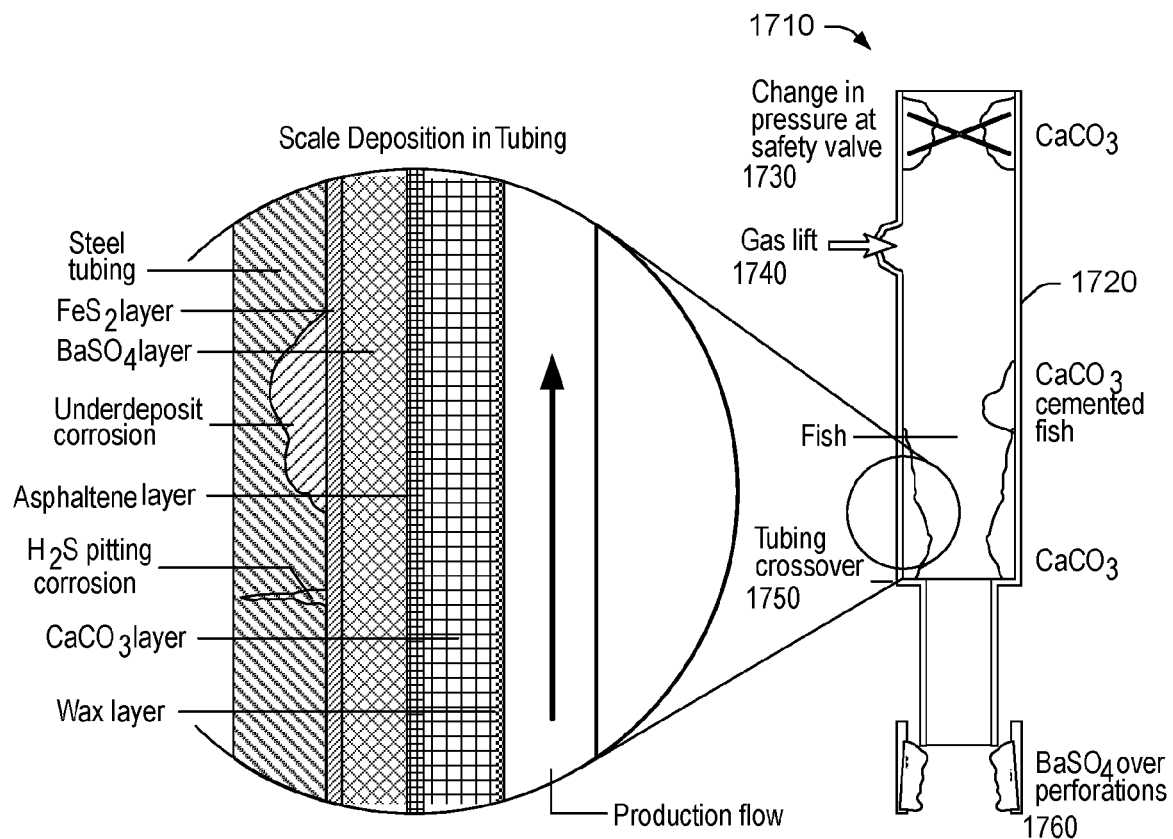
FIG. 17 illustrates an example of a system.

FIG. 17 shows an example of a system that includes a tubular assembly 1710 that includes a tubing 1720, a valve 1730, gas lift equipment 1740, a tubing crossover, and perforations 1760.

Scale can occur on various time scales. Under some conditions, scale may form in tubing of a production well within a day to an extent that production drops by more than ten percent. In a North Sea production well in the Miller field, production fall from approximately 30,000 B/D (e.g., 4770 m$^3$/d) to approximately zero in 24 hours. Scale can develop in formation pores near a wellbore and reduce formation porosity and permeability. Scale can block flow by clogging perforations or by forming a thick lining in production tubing. Scale can coat and damage downhole equipment, such as, for example, valves, gas-lift mandrels, etc.

The Miller field is a deep reservoir under the North Sea, approximately 240 kilometers north-east of Peterhead in UKCS Blocks 16/7b and 16/8b. The Miller reservoir is located at a depth of approximately 4090 meters below sea level and has an estimated area of 45 square kilometers and a maximum thickness of approximately 110 meters. Reservoir pressure is approximately 45,000 kilopascals and reservoir temperature is approximately 120 degrees C. Oil produced from the Miller field has been measured to have a gravity of approximately 39 degrees API and a sulfur content of approximately 0.40 percent.

Gas export from the Miller field utilized a sour gas pipeline system that includes a 241 km, 30-inch-diameter (760 mm) sea-line to St. Fergus and then onward via a 17.5 km 26-inch-diameter (660 mm) land-line to Peterhead Power Station. Oil from the Miller field was pumped via a 7.5 km-long, 18-inch-diameter (460 mm) export pipeline to the Brae A platform and then onwards via the Forties pipeline system to the mainland; noting that a 8.5 km, 16-inch-diameter (410 mm) gas pipeline between the Brae B and various Miller field offshore platforms allowed gas to be exported from Brae for use in the Miller field (e.g., for enhancing oil recovery).

As explained, various types of fluid system components can include one or more piezoelectric and graphene regions. As an example, one or more of the aforementioned fluid systems of a field and/or in fluid communication with a field may include one or more piezoelectric and graphene regions.

As mentioned, one or more piezoelectric and graphene regions of one or more fluid system components may be utilized to provide signal(s) as to scaling. In various instances, wells producing water can be likely to develop deposits of inorganic scales. Such scales can and do coat various types of fluid system components (e.g., perforations, casing, production tubulars, valves, pumps, and downhole completion equipment, safety equipment, gas lift mandrels, etc.). If allowed to proceed without mitigation, scaling can limit production and may result eventually in shutting in a well (e.g., well abandonment).

Scale-removal techniques can involve shutting down production, moving in a workover rig to pull damaged tubing out of a well, treating for scale at the surface of a well, replacing tubing, etc.

As an example, one or more piezoelectric and graphene regions of one or more fluid system components can be utilized to detect scaling and may be utilized to detect degree of scaling. As explained, various fluid system components may include anti-scaling features (e.g., anti-scalant(s), coatings, etc.). As an example, a signal or signals from one or more piezoelectric and graphene regions may be utilized for determining whether to perform an operation that aims to mitigate or otherwise address scaling. As an example, such a signal or signals may be part of an automated, semi-automated and/or manual control system that can control such an operation or operations.

FIG. 17 shows some examples of scale in tubing. The location of scale deposits in tubing can vary from downhole perforations 1760 to the surface where it constrains production through tubing restrictions, fish, valves 1730 and gas-lift equipment 1740. Scale may be layered and sometimes covered with a waxy or asphahene coating (insaft). Pitting and corrosion on steel can develop under scale, for example, due to bacteria and sour gas, which can diminish steel integrity (e.g., weaken steel tubing).

In FIG. 17, fish can refer to one or more items in a wellbore. Fish can be junk metal, a hand tool, a length of drillpipe or drill collars, or an expensive MWD and directional drilling package. A lost or damage component may be referred to as "the fish", As equipment put into a wellbore tends to be accurately measured and sketched, an appropriate fishing tool may be selected if the equipment is to be fished out of the hole.

As to some examples of scale, consider carbonates (Ca (II), Mg(II), and Fe(II)), sulfates (Ca(II), Ba(II), Sr(II), and Ra(II)), oxides and hydroxides (Fe(II), Fe(III), Mg(II) and Cu(II)), sulfides (Fe(II), Cu(II) and Zn(II)), sodium chloride (NaCl), etc.

As to carbonate scales, calcium carbonate scale tends to be common in oil field well environments (e.g., North Sea, etc.). Various deposits can include calcite, which tends to be a relatively thermodynamically stable crystalline polymorph of $CaCO_3$. Aragonite and vaterite are two polymorphs in order of decreasing thermodynamic stability. While the foregoing crystals have the chemical formula $CaCO_3$, they differ in crystal structure. Other known minerals include magnesite ($MgCO_3$) and iron carbonate siderite ($FeCO_3$).

Formation water may have a concentration of 200,000-250,000 mg/l TDS and where mineral composition can have a complex dependence on mineral digenesis. In carbonate and calcite cemented sandstone reservoirs, there tends to be a high concentration of divalent calcium (Ca+) and magnesium (Mg+) ions. Scale tends to occur responsive to a change in the chemistry equilibrium. Interactions in chemistry can be complex; noting the following phenomena can be helpful in understanding scale deposition: Carbon dioxide dissolves in water to form carbonic acid and carbonic acid dissociates to form carbonate and bicarbonate, and, by Le Chatelier's principle, a reaction will move to the right with respect to the flowing equilibrium equation, in attempt to increase the pressure by forming more $CO_2$ gas:

$$2HCO^{3-} = CO_3^{2-} + H_2O + CO_2$$

Precipitation can produce a further pressure drop, leading to further precipitation. As a result of such a reaction, pH tends to increase and calcium carbonate can become supersaturated enough to precipitate. The kinetics of the reaction can be a function of temperature. As explained, various chemical reactions can be linked where a parameter may affect one or more other parameters.

$$Ca^{2+} + CO_3^{2-} = CaCO_3(s)$$

Carbonate scale can occur at points where there is a pressure drop, which can be at one or more points in a system. For example, it can be downstream, at topside, at a choke valve, a safety valve, etc. Calcium carbonate tends not to deposit in a well due to a $CO_2$ high concentration and hence a low pH value. However it may occur in a producing well responsive to pressure decline.

As explained, scaling can pose various challenges, particularly in production, whether downhole, subsea, etc. Scaling can impact hydrocarbon production, particularly in deepwater, high pressure and high temperature (HPHT) production, and can be a differentiator for oil service companies and tool manufacturers.

As explained, various types of scale and scaling mechanisms exist. When caused by water, as often the case in hydrocarbon production, scaling is caused by the inverse solubility of salts that have recrystallized from solution onto equipment surfaces. Scaling can occur as a result of changes in water composition (e.g., water mingling), pH, temperature, pressure, outgassing, etc. (e.g., a parameter or parameters that can influence salt solubility).

Calcium carbonate can be a common constituent of scales, particularly in high-temperature $CO_2$ wells. And, as mentioned, other scales forming salts may include one or more of magnesium carbonate, calcium sulfate, barium sulfate, strontium sulfate, iron carbonate, iron sulfide, among others. Such scale forming salts can originate from rocks in contact with subterranean hydrocarbon and/or water. Sulfate scales can be characteristic of reservoir water mingling; having been observed at sand screens, among others.

One or more pieces of equipment of FIG. 17 can include graphene as formed to be part of a circuit that can generate a signal, which may be an inherent signal or a signal that is altered (e.g., responsive to force, degradation, etc.).

As an example, one or more pieces of equipment in the examples of FIGS. 11, 12, 13, 14, 15, 16 and 17 may include graphene as converted from a polymeric material. As explained, graphene can be formed to be part of a circuit that can provide a signal, for example, as to one or more conditions of one or more fluid system components. As an example, a surface component and/or a subsurface component (e.g., a downhole component, etc.) may include graphene as formed to be part of a circuit that can provide a signal during one or more oil and/or gas related operations.

As an example, a fluid system component can include a support body that includes a surface; and an electrical circuit supported at least in part by the surface, where the electrical circuit includes graphene adjacent to a composite material that includes a polymer convertible to graphene, and where the electrical circuit generates a signal responsive to deformation of at least a portion of the electrical circuit. In such an example, the graphene can include graphene that is from the polymer convertible to graphene. For example, a laser or other energy source may be utilized to convert a polymer to graphene. Where a laser is utilized, the graphene may be referred to as laser-induced-graphene (LIG). Where a portion of a region that includes polymer has been converted to graphene, the graphene can be adjacent to polymer that has not been converted to graphene. In such an example, the polymer can be part of a composite material.

As an example, a composite material can include at least one ceramic material. As an example, a composite material can include at least 35 percent by weight of polymer. As an example, a fluid system component can include PEEK as a polymer, which may be a polymer of a composite material where at least a portion of the PEEK is converted to graphene, for example, to form one or more conductive elements of an electrical circuit (e.g., one or more electrical conductors of an electrical circuit).

As an example, a fluid system component can include an electrical circuit that includes a piezoelectric material electrically coupled to at least a portion of graphene as converted from one or more polymers, where deformation of the piezoelectric material generates a signal.

As an example, a fluid system component can include a support body that is metallic and electrically conductive. In such an example, at least a portion of a composite material can electrically insulate the support body from at least a portion of graphene as converted from one or more polymers.

As an example, a fluid system component can include a composite material that is degradable and/or a support body that is degradable.

As an example, a fluid system component can include graphene, converted from a polymer or polymers, that is disposed in two layers to define a capacitor where deformation of an electrical circuit formed in part by the graphene alters capacitance of the capacitor.

As an example, a fluid system component can include graphene, converted from a polymer or polymers, that is disposed in two layers where a piezoelectric material is disposed at least in part between the two layers. In such an example, the piezoelectric material may respond to force (e.g., pressure) such that one or more electrical signals can be generated in at least a portion of the graphene. As an example, force can be fluid force, degradation force, mechanical force (e.g., rock movement, component movement, etc.), etc.

As an example, in a seismically active region, one or more fluid system components may provide for sensing responsive to movement caused by seismic activity. For example, consider a fluid system component in a borehole, which may be a wellbore of a completed well. Where an earthquake occurs, the fluid system component may sense movement and/or one or more forces experienced by the fluid system component. For example, consider a crack in the fluid system component, a shift in force applied by rock to one side of the fluid system component, etc. In such examples, a fluid system component that includes one or more piezoelectric and graphene regions may provide for assessment of the fluid system component responsive to seismic activity, which may be natural and/or artificial (e.g., consider hydraulic fracturing, blasting, earth moving operations, etc.).

As an example, a fluid system component can include a cover material that is disposed over at least a portion of graphene where the graphene is converted from one or more polymers. In such an example, the cover material can include an anti-scalant. For example, the cover material may act to reduce scaling when the cover material is exposed to water that includes various minerals. As an example, an electrical circuit that is formed in part by the graphene may provide for sensing a state of the cover material, for example, to determine how well it is performing to reduce scaling. Where scaling is not sufficiently reducing, the electrical circuit may provide a signal that can call for one or more anti-scaling operations.

As mentioned, a support body can be degradable. For example, consider degradation of a support body that deforms an electrical circuit that is formed at least in part by graphene as converted from one or more polymers.

As an example, a fluid system component can include an electrical circuit that is degradable responsive to exposure to fluid, which may be fluid in a downhole environment, an offshore environment, etc.

As an example, a method can include providing a fluid system component that includes a support body that includes a surface and an electrical circuit supported at least in part by the surface, where the electrical circuit includes graphene adjacent to a composite material that is a polymer convertible to graphene, and where the electrical circuit generates a signal responsive to deformation of at least a portion of the electrical circuit; performing a fluid operation involving the fluid system component; and measuring the signal responsive to the fluid operation deforming at least a portion of the electrical circuit. In such an example, the method can include controlling the fluid operation based at least in part on measuring the signal.

As an example, a method can include depositing a composite material that includes a polymer convertible to graphene on a support body of a fluid system component; and converting a portion of the polymer to graphene to form an electrical circuit, where deformation of the electrical circuit generates a signal. In such an example, the method can include depositing a cover material over at least a portion of the graphene and/or the method can include depositing an insulator directly on the support body prior to depositing the composite material on the support body, where the insulator electrically insulates at least a portion of the graphene from the support body.

Although only a few examples have been described in detail above, those skilled in the art will readily appreciate that many modifications are possible in the examples. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A fluid system component comprising:
   a support body; and
   an insulator layer disposed over the support body, wherein the insulator layer comprises a polymer, wherein at least a portion of the insulator layer is converted to graphene as a result of exposure of the insulator layer to fluid in a downhole environment; and
   a composite layer disposed over the insulator layer, wherein the composite layer comprises a composite material having at least a graphene region and a piezoelectric region, wherein the composite layer is configured to form an electrical circuit;
   wherein the electrical circuit generates a signal responsive to deformation of at least the converted portion of the insulator layer.

2. The fluid system component of claim 1, wherein the composite layer comprises at least one ceramic material.

3. The fluid system component of claim 1, wherein the insulator layer comprises at least 35 percent by weight of the polymer.

4. The fluid system component of claim 1, wherein the polymer comprises PEEK.

5. The fluid system component of claim 1, comprising a protective layer that is disposed over at least a portion of the composite layer.

6. The fluid system component of claim 1, wherein the insulator layer is degradable.

7. The fluid system component of claim 1, wherein the graphene region of the composite layer is disposed in two layers to define a capacitor wherein deformation of the electrical circuit alters capacitance of the capacitor.

8. The fluid system component of claim 1, wherein the graphene region is disposed in two layers, and wherein the piezoelectric region is disposed at least in part between the two layers.

9. The fluid system component of claim 1, wherein the composite layer is degradable and responsive to exposure to fluid in a downhole environment.

10. The fluid system component of claim 1, wherein the support body is metallic and electrically conductive.

11. The fluid system component of claim 10, wherein at least a portion of the insulator layer is configured to electrically insulate the support body from at least a portion of the graphene.

12. The fluid system component of claim 5, wherein the graphene portion comprises one or more patterns forming an array.

13. The fluid system component of claim 5, wherein the protective layer comprises an anti-sealant.

14. The fluid system component of claim 1, wherein the support body is degradable.

15. The fluid system component of claim 14, wherein degradation of the support body deforms the electrical circuit.

16. A method comprising:

providing a fluid system component that comprises a support body, an insulator layer disposed over the support body, and a composite layer disposed over the insulator layer, wherein the insulator layer comprises a polymer, wherein at least a portion of the insulator layer is converted to graphene as a result of exposure of the insulator layer to fluid in a downhole environment, wherein the composite layer comprises a composite material having at least a graphene region and a piezoelectric region, wherein the composite layer is configured to form an electrical circuit, and wherein the electrical circuit generates a signal responsive to deformation of at least the converted portion of the insulator layer;

performing a fluid operation involving the fluid system component; and measuring the signal responsive to the fluid operation deforming at least a portion of the electrical circuit.

17. The method of claim 16, further comprising:

controlling the fluid operation based at least in part on measuring the signal.

18. A method comprising:

forming an insulator layer over a support body of a fluid system component, wherein the insulator layer comprises a polymer, wherein at least a portion of the insulator layer is converted to graphene as a result of exposure of the insulator layer to fluid in a downhole environment;

forming a composite layer over the insulator layer, wherein the composite layer comprises a composite material having at least a graphene region and a piezoelectric region; and converting at least a portion of the insulator layer to graphene as a result of exposure of the insulator layer to fluid in a downhole environment, wherein the composite layer is configured to form an electrical circuit, wherein deformation of at least the converted portion of the insulator layer causes the electrical circuit to generate a signal.

19. The method of claim 18, further comprising:

forming a protective layer over at least a portion of the composite layer.

20. The method of claim 18, wherein the insulator layer electrically insulates at least a portion of the graphene from the support body.

* * * * *